United States Patent [19]

Song

[11] 4,087,754
[45] May 2, 1978

[54] DIGITAL-TO-ANALOG CONVERTER FOR A COMMUNICATION SYSTEM

[75] Inventor: Ching-Long Song, Columbus, Ohio

[73] Assignee: North Electric Company, Galion, Ohio

[21] Appl. No.: 717,458

[22] Filed: Aug. 24, 1976

Related U.S. Application Data

[63] Continuation of Ser. No. 482,380, Jun. 24, 1974, abandoned.

[51] Int. Cl.² ............................................. H03K 13/24
[52] U.S. Cl. .......................... 325/38 B; 340/347 DD
[58] Field of Search ........................ 325/38 R, 38 B; 340/347 DA, 347 DD; 332/11 D

[56] References Cited

U.S. PATENT DOCUMENTS

| B 295,674 | 1/1975 | McDonald | 340/347 DD X |
| 3,596,267 | 7/1971 | Goodman | 235/154 X |
| 3,638,219 | 1/1972 | Harms | 325/38 B X |
| 3,707,680 | 12/1972 | Gabbard et al. | 325/38 B |
| 3,715,722 | 2/1973 | Hall | 178/DIG. 3 X |
| 3,723,909 | 3/1973 | Condon | 325/38 B X |
| 3,750,144 | 7/1973 | Bolus et al. | 340/347 DD |
| 3,772,678 | 11/1973 | Deschenes et al. | 340/347 DD |
| 3,795,900 | 3/1974 | Monford | 325/38 B X |
| 3,824,590 | 7/1974 | Limb | 325/38 B X |
| 3,825,831 | 7/1974 | Ishiguro | 325/38 B |
| 3,831,167 | 8/1974 | Tewksbury | 325/38 B X |
| 3,878,465 | 4/1975 | Stephenne et al. | 325/38 B |
| 3,906,400 | 9/1975 | Gooding et al. | 325/38 B X |
| 4,035,724 | 7/1977 | Stephenne et al. | 325/38 B |
| 4,044,306 | 8/1977 | Villeret et al. | 325/38 B |

OTHER PUBLICATIONS

Analog Devices, Inc., Analog-Digital Conversion Handbook, 6/1972, pp. II-16 through II-27.

Primary Examiner—Thomas J. Sloyan
Attorney, Agent, or Firm—Emrich, Root, O'Keeffe & Lee

[57] ABSTRACT

In an encoder portion, a communication system converts analog signals, into linear delta modulated (hereafter LDM) signals and LDM signals into compressed pulse code modulated (hereafter CPCM) signals while in a decoder portion, the system reconstructs the CPCM signals into LDM signals and then analog signals substantially corresponding to those originally input into the system.

3 Claims, 12 Drawing Figures

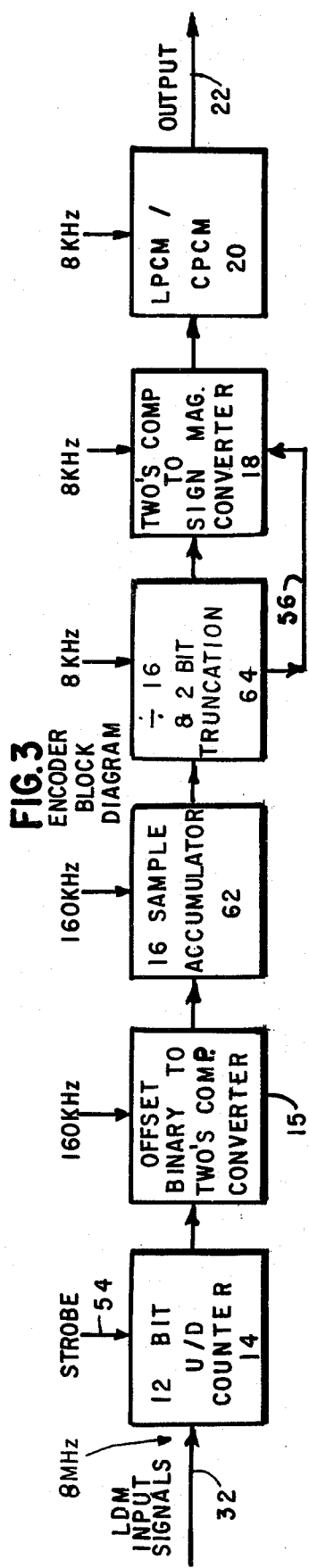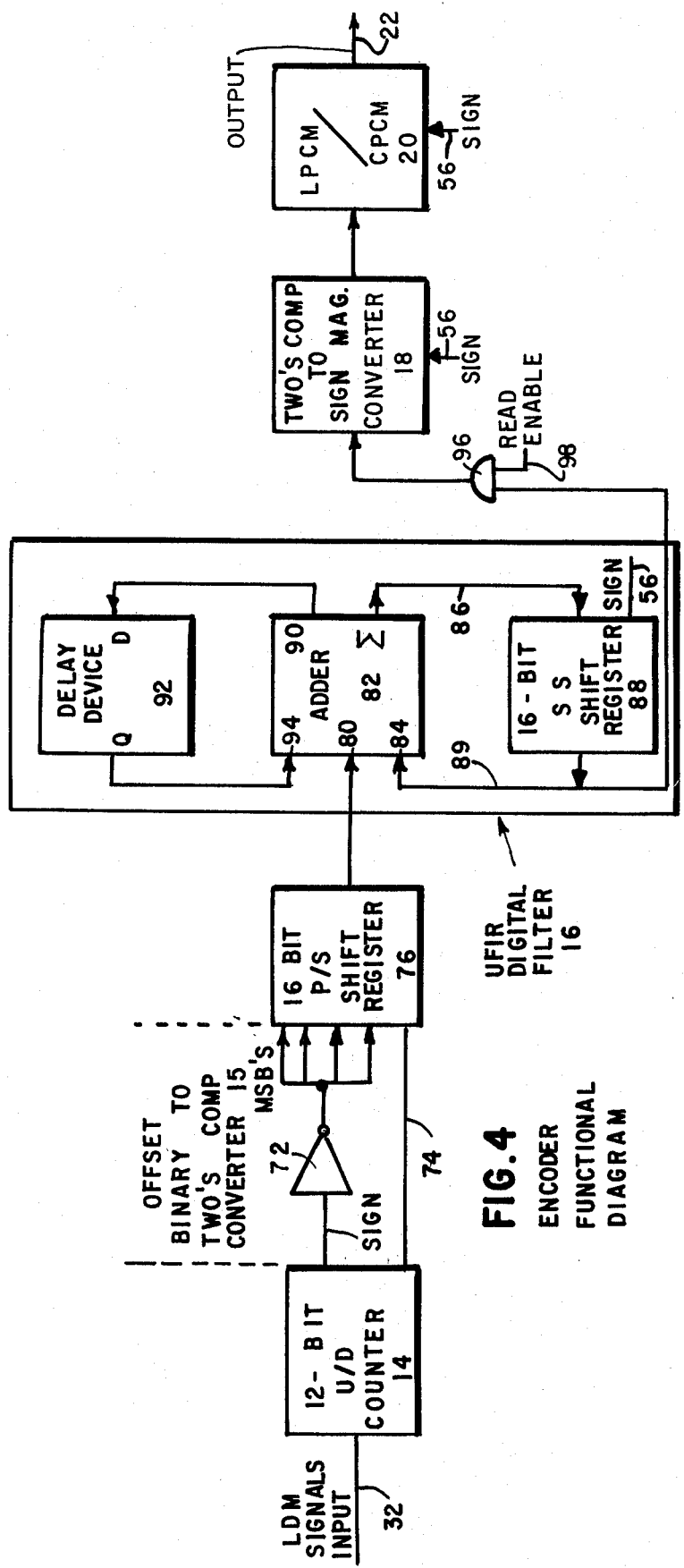

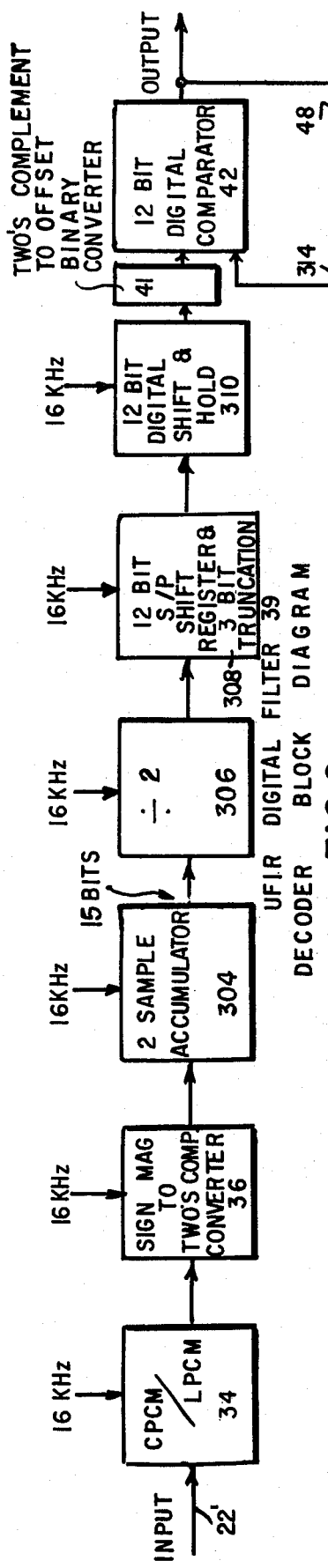
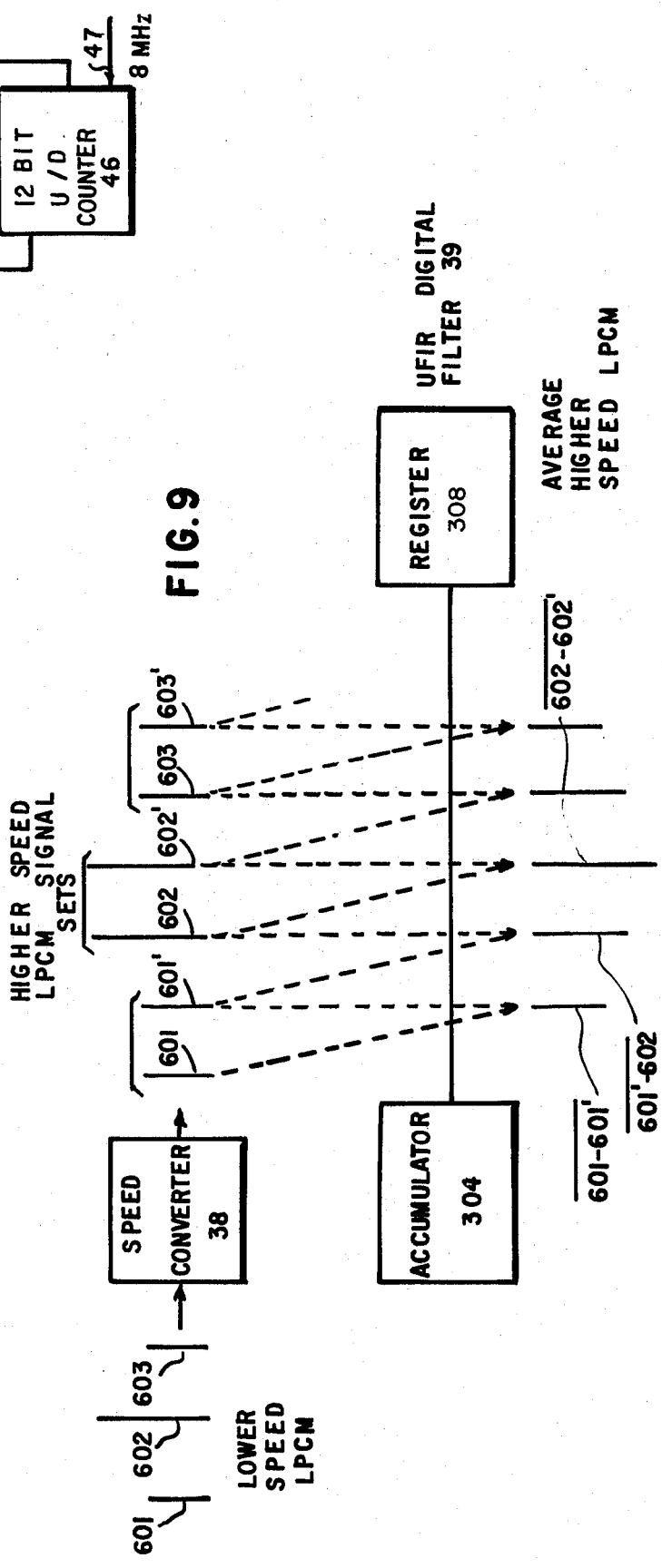

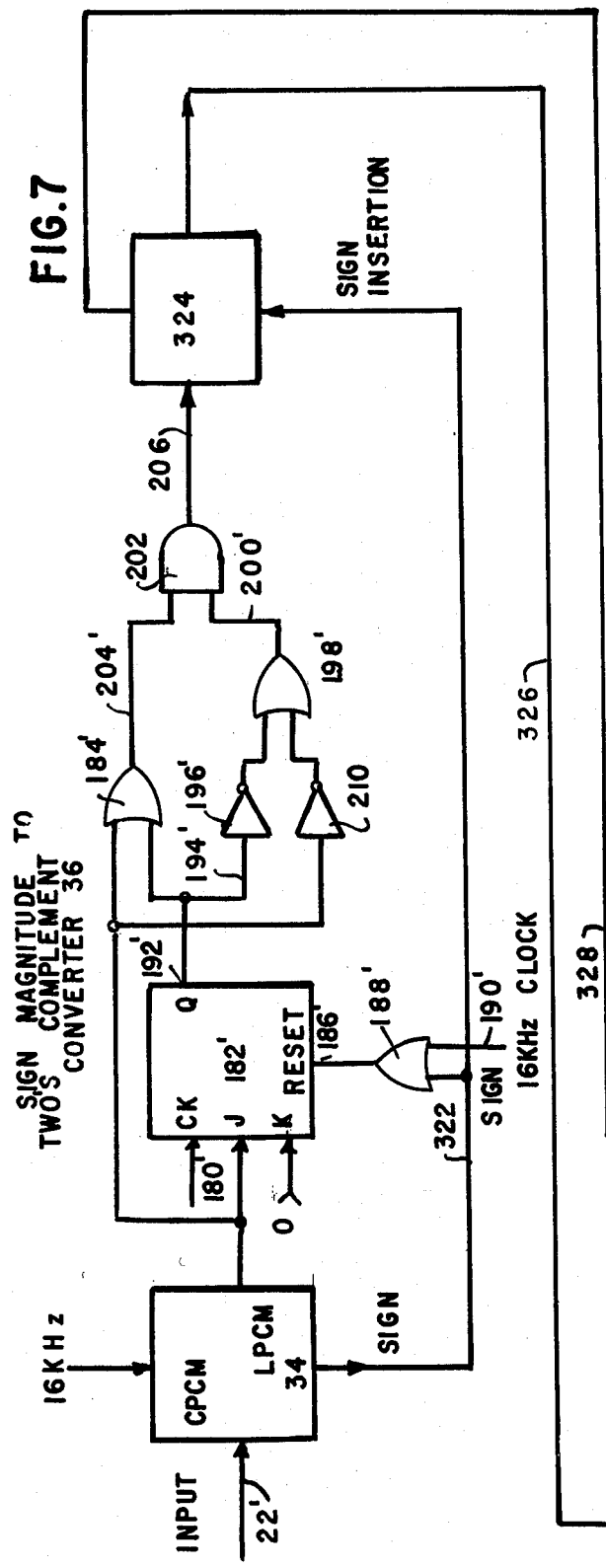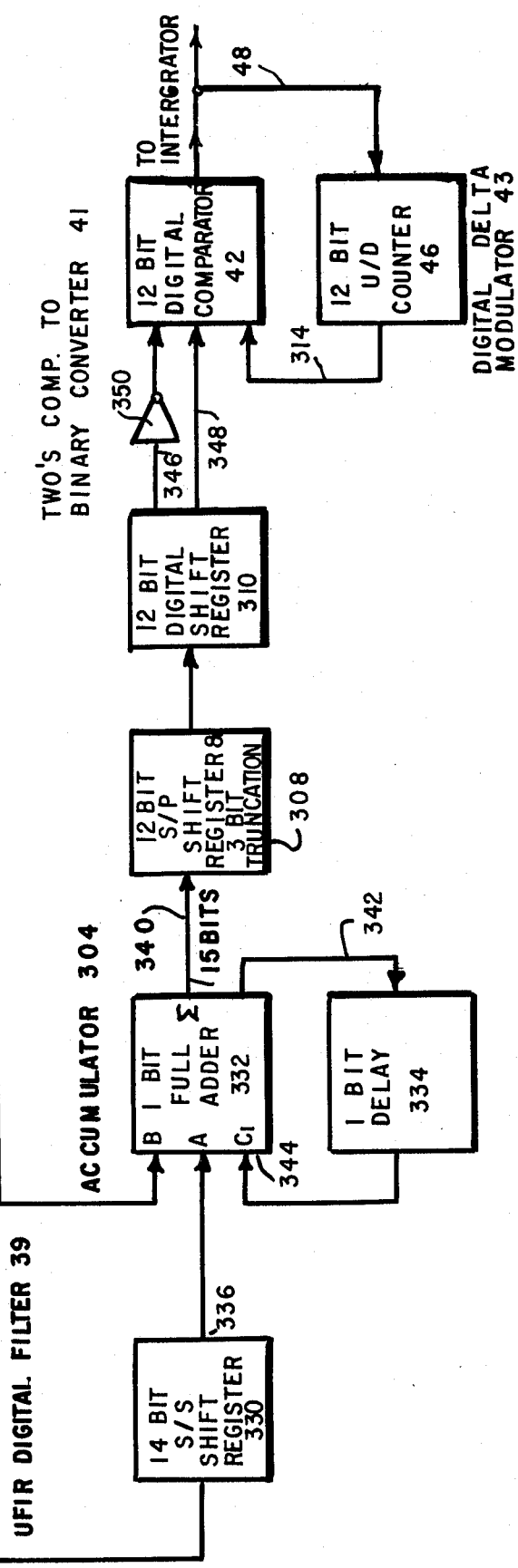
FIG.7

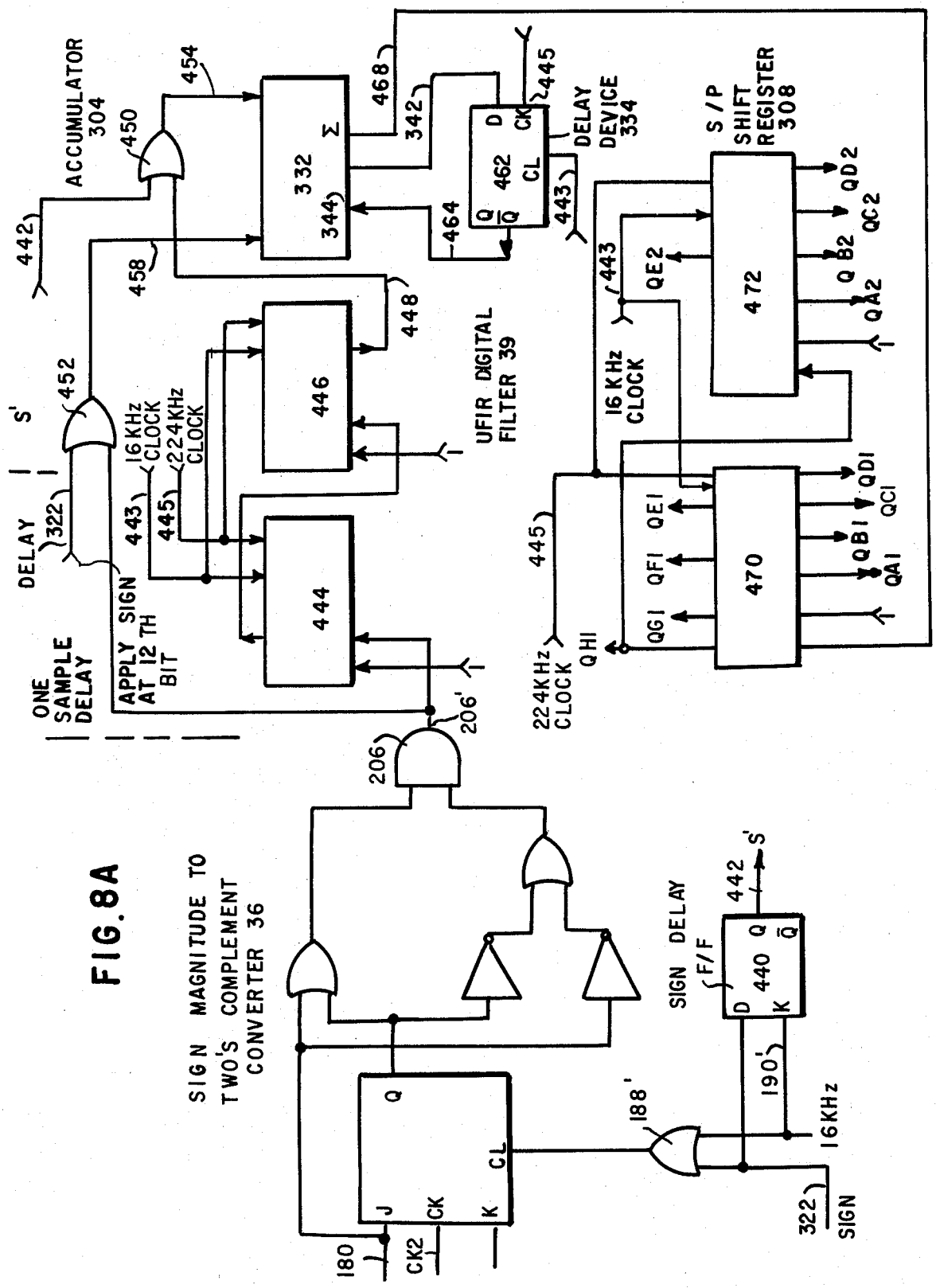

DIGITAL-TO-ANALOG CONVERTER FOR A COMMUNICATION SYSTEM

This is a continuation of application Ser. No. 482,380, filed June 24, 1974, now abandoned.

BACKGROUND OF THE INVENTION

This invention relates to a communication system and, particularly, to a communication system for converting linear delta modulated (hereafter LDM) signals into compressed pulse code modulated (hereafter CPCM) signals and to a system for converting CPCM signals into LDM signals.

The demand for communication services has been steadily increasing. In meeting this demand, it has proved effective in some communication systems to convert analog signals presented to the system into digital signals, transmit the digital signals, and then reconvert the digital signals into analog signals corresponding to those originally input into the system. One example of a communication system in which such digital conversion of analog signals has proved to have particular utility is a telephone communication system.

In telephone systems, it is known to periodically sample a continuous input analog signal, such as a voice signal and to create a digital signal of an encoded series of pulses representing by its encoding the input analog signal at each instant of sampling. The digital signal is transmitted and then decoded into an analog signal corresponding to that originally input into the system. Several schemes for so digitally encoding analog signals are known.

In one encoding scheme, the amplitude of a continuous analog signal is periodically sampled and each sample converted into a digitally encoded pulse sequence or word representing a quantum of analog signal amplitudes including that of the signal sample. This operation is called sampling and quantizing the analog signal. If the quantum levels or steps of the quantizing operation are uniform for all analog signal amplitudes, the encoded signal is said to be linear pulse code modulated (hereafter LPCM). Each LPCM signal word may then be decoded to form an analog signal of an amplitude substantially corresponding to the amplitude of the analog signal originally input into the system and encoded into the word. Since the continuous input analog signal was periodically sampled, the resulting periodic series of such LPCM signal words may be formed into a continuous analog signal substantially corresponding to the continuous input analog signal.

In the quantizing process, the exact level of the analog input signal at the sampling instant is, as described, approximated by one of a number of discrete values or quantum levels digitally encoded as the LPCM signal. The difference between the instantaneous amplitude of the input analog signal and the quantum level actually transmitted is called quantizing error and gives rise to what is variously known as quantizing noise or quantizing distortion.

Quantizing distortion is especially objectionable and very often intolerable when the instantaneous amplitude of the input analog signal is small, but is usually of little or no significance when the instantaneous amplitude of the input analog signal is high because the low amplitude of the input signals permits a relatively low level of quantizing noise to significantly degrade the ratio of signal to noise while a higher amplitude of the input signal can tolerate greater quantizing noise within an acceptable ratio of signal to noise. It is therefore desirable to have smaller quantum levels for lower amplitudes of the input signal to achieve closer correspondence between the quantum level of the encoded signal and the actual input analog signal at lower amplitudes than for higher amplitude input signals. Of course the size of the quantum levels for all input signal amplitudes could be decreased by this produces an undesirable increase in the total number of quantum levels, requiring, for example, more binary bits to represent the signal as a digitally encoded word.

The suggested non-linear redistribution of the size of the quantizing levels is called companding, a verbal contraction of the terms compression and expanding. The purpose of companding is then to reduce the quantizing impairment of the original signal without unduly increasing the total number of quantizing levels by quantizing on a non-linear rather than a linear basis.

It is current practice with telephone systems to compand encoded analog signals on either a "mu-law" or an "A-law" companding scheme as described by H. Kaneko in an article entitled "A Unified Formulation of Segment Companding Laws and Synthesis of Codecs and Digital Companders," Bell System Technical Journal, September, 1970. Both these laws define segments or chords of a piecewise linear curve generally exponentially increasing for increasing levels of input analog signal amplitude. Each chord is divided into an equivalent number of quantization steps defining between them the intervals or quantization levels into which the analog signal will be encoded. The companding encoding scheme is then to encode each sampled analog signal amplitude into a combined sequence of two encoded signals, one representing the chord generally corresponding to the analog signal amplitude and the other representing the step along the identified chord more precisely corresponding to the analog signal amplitude. The resulting signals are then called compressed pulse code modulated signals (hereafter CPCM) or companded pulse code modulated signals. One device for so encoding input analog signals is disclosed in co-pending U.S. Pat. application Ser. No. 385,095 filed Aug. 2, 1973 in the names of Wintz, Sergo and Song. Of course, the CPCM signals may also be decoded into an analog signal. One device for so decoding CPCM signals is disclosed in co-pending U.S. Pat. applicaton Ser. No. 402,342 filed Oct. 1, 1973 in the names of Wintz and Sergo.

Still another scheme for encoding analog signals periodically samples the analog signal and compares the amplitude of the signal at each sampling instant with a signal representing the predicted amplitude of the analog signal from the immediately preceding sampling instant to form a binary-encoded signal from the comparitor indicating by its one of the two possible binary states whether the instant sample of the analog signal is greater or less than the sample at the preceding instant. In general, the signal from the comparator is integrated to locally generate a signal representing the amplitude of the analog signal at the preceding sampling instant for comparison in the comparator with the instantaneous sample of the analog signal. Then, for example, if the analog signal is greater at one sampling instant than the locally generated signal representing the amplitude of the analog signal at the immediately preceding sampling instant, the comparator provides a high logic level signal, and, if the signal is less than the locally generated signal, the comparator provides a low logic level signal. Such binary-encoded signals are called linear delta modulated (hereafter LDM) signals.

The effectiveness of such LDM signals in representing analog signals largely depends upon the accuracy of the locally generated signal representing a preceding sample of the analog signal. It has been shown that the relative accuracy of the locally generated signal may be maximized by keeping the sampling rate high and the increments or quantizing steps in locally generating the signal representing the preceding analog signal relatively small, to thereby provide a large number of LDM signals integrated to closely approximate the input signal so that the quantizing error in encoding an individual LDM signal will not represent a substantial excursion of the LDM signal from the actual analog input signal. Unfortunately, the sampling rates required to achieve the same quality or signal to noise ratio and dynamic range from such LDM signals in comparison to a similar signal encoded in a 7-bit "mu-law" CPCM scheme is 19.6 MHz and, in an 8-bit scheme, 39.2 MHz, frequencies substantially at the limit of modern digital technology. At the same time, attempts to provide variable size integration steps to the integrator, usually called adaptive delta modulation, introduce additional complication to delta modulation equipment thereby reducing the attractiveness of its theoretical simplicity. One example of an adaptive delta modulation device is disclosed in U.S. Pat. No. 3,652,957 issued Mar. 28, 1972 in the name of Goodman, but it requires high speed LDM signal encoding devices to provide high quality adaptive delta modulation signals. These problems have inhibited the commercial use of delta modulation encoding schemes.

In addition, the CPCM encoding scheme was first developed and, generally in a 6 and 7-bit plus sign bit format, placed in substantial commercial use in telephone systems. It is obviously desirable to have every portion of a telephone system compatible with every other portion of the system to permit the interchange of signals between every portion of the telephone system. Given the large number of telephone systems already in use with the CPCM encoding scheme, it is economically unfeasible to eliminate all telephone equipment utilizing the CPCM encoding scheme and substitute equipment utilizing a delta modulation encoding scheme. This problem has also inhibited the use of delta modulation.

Nevertheless, the relative simplicity of the LDM encoding scheme makes desirable the use of this scheme in telephone equipment, particularly telephone equipment between a subscriber and a central office which generally is not now digitally encoded. As is apparent from a mere description of the encoding scheme in which a CPCM signal has been described as a two-section, nonlinearly encoded digital word and an LDM signal described as a single binary-encoded digit, a delta modulating scheme offers substantial simplicity of equipment necessary for its implementation in comparison to a CPCM encoding device. Given the large number of telephone subscribers, the simplicity and thus lower cost of delta modulation equipment offers economic attraction for digitally encoding signals between each telephone subscriber and means processing signals from the subscriber. Therefore, there is a desire to introduce delta modulation devices into a telephone system.

In order to achieve the desired compatibility between such delta modulated portions of a telephone system and portions already utilizing a CPCM encoding scheme it is then necessary to reversibly convert signals between the LDM and CPCM signal encoding schemes. One such conversion device is disclosed in related U.S. Pat. Nos. 3,707,712 issued Dec. 26, 1972 and 3,772,678 issued Nov. 13, 1973, both in the names of Deschenes and Villeret. Another device for conversion of analog to linear delta modulated signals, and then to pulse code modulated signals is disclosed by D. J. Goodman in an article titled "The Application of Delta Modulation to Analog-to-PCM Encoding in The Bell System Technical Journal," Vol. 48, No. 2, February 1969, Pages 321–343.

SUMMARY OF THE INVENTION

It is an object of the invention to provide a communication system converting LDM signals into CPCM signals and CPCM signals into LDM signals.

It is a further object of the invention to maintain the quality of signal encoding while reducing the necessary sampling frequency of an LDM signal and, more particularly, to implement the signal encoding with linear circuits which permit the circuits to be condensed through the use of large scale integrated circuit techniques.

It is a further object of the invention to provide means for digitally decoding a LPCM signal into a LDM signal, and, more particularly, digitally decoding the signals without additional known sampling and hold means.

To these ends, the invention provides a communication system which converts LDM signals into CPCM signals and converts CPCM signals into LDM signals. An encoder portion of the system converts LDM to CPCM signals, it being understood that the LDM signals may be derived from successive samples of a continuous, time varying analog signal such as a voice signal in a device including an integrator and a comparator strobed by signals determining the frequency of the LDM signals. The encoder has a reversible or up-down counter which totals the successive LDM signals into a periodically output encoded word which, because it represents the level of the total LDM signals at the instant the word is output, is an LPCM signal word. A uniform finite impulse response (hereafter UFIR) digital filter receives the successive LPCM signal words from the counter at a high rate, adds each signal word to the sum of other word signals and averages and samples the resulting LPCM signals at a low rate to provide low speed LPCM signals. A converter converts these LPCM signals to CPCM signals of the same low speed.

The UFIR digital filter functions to provide a higher quality or signal to noise ratio and dynamic range to the low speed LPCM signals from LDM signals of a given rate than the signal quality obtained without the filter. A preferred embodiment is intended for use in a telephone system requiring 8 KHz CPCM signals, the CPCM signal frequency in common commercial use. In this embodiment the UFIR digital filter then functions to reduce the LDM signal rate required for a given quality of output 8 KHz CPCM signals. Specifically, it may be theoretically demonstrated that an embodiment including a UFIR digital filter of an order of 16 will achieve $mu=255$, 7-bit CPCM quality signals from LDM signals of 8 MHz, instead of the 19.6 MHz LDM signals required without the filter and $mu=255$, 8 bit CPCM quality signals from LDM signals of 16 MHz instead of the 39.2 MHz. The resulting 8 MHz or 16

MHz signals are more readily achieved within the state of the linear and digital circuit design art than the otherwise necessary 19.6 MHz or 39.2 MHz LDM signals. It will also be noted that there is no sampling and hold device in the encoder.

A decoder portion of the embodiment converts CPCM signals into LDM signals which, or course, may be integrated into analog signals at the same integrating speed as in the encoder. The decoder first converts the input CPCM signals into LPCM signals. A digital delta modulator then digitally compares each LPCM signal with a locally generated digital signal for forming LDM signals each being a binary bit encoded in logic state depending upon whether the LPCM signal was greater or less than the locally generated signal. The locally generated digital signal is the total of the preceding LDM signals as accumulated in an up-down counter. In a preferred embodiment of the decoder, the digital comparator compares the LPCM and locally generated signals at a frequency greater than that of the LPCM signals to permit the accumulated total of the LDM signals in the up-down counter to quickly approach the input LPCM signal. The frequency of the digital comparison is preferably the same as that of the strobe signal speed in an analog comparator of the encoder, so that the LDM signal generated at the output of the digital comparator has the same frequency as in the encoder, and the analog signal can be reconstructed with an integrator of the same design as that used in the encoder. It will be noted that there is no sampling and hold device in the entire encoding and decoding processes.

One embodiment of the decoder also has a signal speed converter converting signals from the input frequency of the CPCM signals to a higher frequency by repeating each of lower speed LPCM signals first converted from the CPCM signals into sets of higher speed LPCM signals. Each successive higher speed LPCM signal is then averaged with the succeeding signal to form average higher speed LPCM signals so that waveform distortion of the reconstructed analog signal can be reduced.

For convenience in implementing the preferred embodiments of the encoder and decoder, these preferred embodiments also have means reversibly changing the code format of signals processed in the embodiments from two's complement to sign and magnitude format.

DESCRIPTION OF THE DRAWINGS

A preferred embodiment which is intended to illustrate and not to limit the invention will now be described with reference to drawings in which:

FIG. 3 is a more detailed block diagram of a portion of the encoder portion shown in FIG. 1;

FIG. 4 is a functional block diagram of the encoder portion shown in FIG. 3;

FIG. 6 is a more detailed block diagram of the decoder portion of the preferred embodiment shown in FIG. 2;

FIG. 7 is a functional block diagram of the decoder portion shown in FIG. 6;

FIGS. 8, 8A, and 8B are schematics of the decoder portion shown in FIG. 7; and

FIG. 9 is an illustration of a signal averaging function performed in a portion of the decoder portion of the preferred embodiment illustrated in FIG. 8.

DESCRIPTION OF THE PREFERRED EMBODIMENT

GENERAL DESCRIPTION OF THE ENCODER

Figure 1:
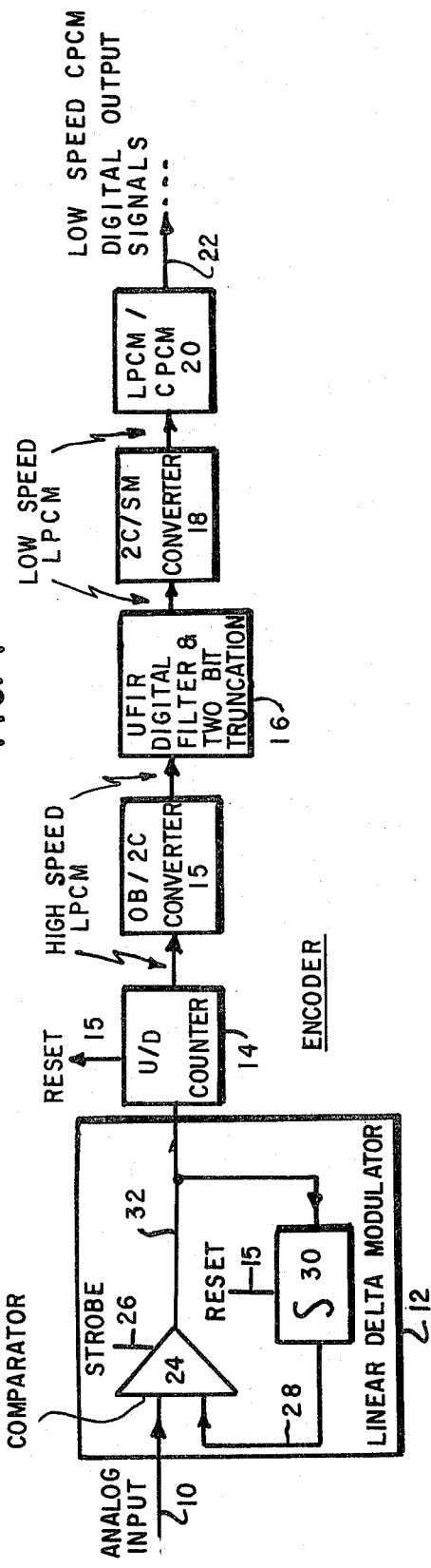
FIG. 1 is a block diagram of an encoder portion of the preferred embodiment.

The preferred embodiment shown in the Figures is a communication system, for example, a telephone system. FIG. 1 shows an encoder portion receiving on a path 10 a time varying continuous analog signal, such as a voice signal. The analog signal amplitude is converted into LDM signals in a linear delta modulator 12. Several successive LDM signals are accumulated in a reversible, up-down counter 14 to form a binary-encoded word representing the cumulative value of the LDM signals and thus a digitally encoded representation of the analog signal amplitude, a LPCM signal. The counter also has means providing a reset signal to a path 15 for assuring coordinate operation of the analog and digital signals.

The signals accumulated in the counter 14 are then output from the counter at a high rate into an offset binary to two's complement converter 15 which converts the code format of each signal into two's complement format for convenient processing. Each of the high rate, two's complement signals is then output into a UFIR digital filter 16 which accumulates each word successively output from the counter through the converter, and then resamples the resulting LPCM signals at a lower rate to provide low speed LPCM signals. Preferably the low speed LPCM signals are at a frequency of 8 KHz, which is commercially used for the transmission of digital signals in telephone systems. For convenient processing, the signals are next converted into a sign and magnitude code format by a two's complement to sign and magnitude code converter 18 and provided in the sign and magnitude code to a LPCM to CPCM signal converter 20. The resulting CPCM signals on path 22 are at the low speed LPCM signal frequency and are then compatible with portions of known telephone systems using 8 KHz CPCM encoded signals. For example, the CPCM signals on path 22 may be multiplexed with other CPCM signals for transmission over a T1 line as known in telephone systems. The embodiment shown in FIG. 1 thus comprises an encoder of a communication system encoding input analog signals through LDM and LPCM signals into CPCM encoded signals.

The linear delta modulator 12 is of known construction and therefore needs only brief description. The modulator receives the analog signals on the path 10 in a comparator 24 which periodically samples the amplitude of the input analog signal at each successive one of strobe frequency signals provided to the comparator on a path 26 from a strobe clock (not shown). At each sampling instant determined by the strobe signals, the comparator 24 compares the amplitude of the analog signal then input on the path 10 with the amplitude of an analog signal on a path 28 from an integrator 30. If the amplitude of the analog signal on the path 10 exceeds that of the analog signal on the path 28, the comparator 24 provides a high logic level signal to an output path 32. If, on the other hand, the amplitude of the analog signal on the path 10 is less than the amplitude of the analog signal on the path 28, the comparator 24 provides a low logic level signal to the output path 32. The output path 32 is connected to the up-down counter 14, as before described, but is also provided to the integrator 30 which adds a quantizing increment to the accumulated total of the previously received signals from the comparator for each high level signal from the comparator received over the path 32 and subtracts a quantizing increment from the total of preceding signals for each low level signal, to locally generate an analog signal approximating the analog signal input into the comparator on the path 10 at the preceding sampling instant. This signal is then provided to the comparator on the path 28 for comparison with the analog signal on the path 10 at the next sampling instant determined by a next strobe signal to the comparator.

Since the up-down counter 14 is to accumulate several of the LDM signals from the linear delta modulator 12 to form the high speed LPCM word signal provided to the UFIR filter 16, it is clear that the strobe signal frequency must exceed the high speed frequency at which counter 14 provides signals to the filter 16. Similarly, the UFIR filter 16 has been described as receiving the high speed LPCM word signals from the up-down counter 14 and providing low speed LPCM signals so that it is clear that the high speed of signals from the counter must exceed the frequency of the low speed LPCM signals from the filter 16. Finally, it has been noted that the low speed of the LPCM and CPCM signals is preferably 8 KHz to be compatible with the similar frequency used in commercial telephone systems. Since the UFIR digital filter 16 functions to provide higher quality LPCM signals from lower frequency LDM signals than are obtained without the filter 16, the fixed 8 KHz output frequency of the LPCM signals then permits a lower strobe frequency to be used for generating the LDM signals to provide the same quality 8 KHz LPCM signals as could be achieved only from higher strobe frequencies without the filter. Of course, it is to be understood that higher frequency strobe signals could be used to provide through the use of the UFIR digital filter higher quality LPCM signals than could be otherwise achieved if the frequency of low speed LPCM and CPCM signals is not constrained to 8 KHz for compatibility with commercial telephone systems.

GENERAL DESCRIPTION OF THE DECODER

Figure 2:
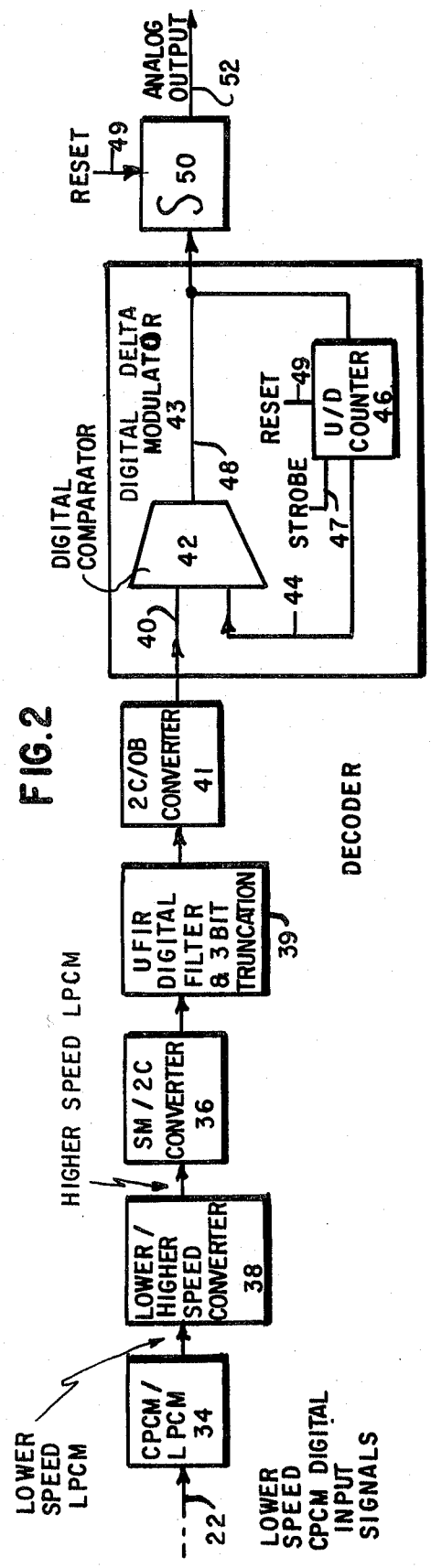
FIG. 2 is a block diagram of a decoder portion of the preferred embodiment.

FIG. 2 illustrates a decoder portion of the preferred embodiment which, in general, reverses the operation of the encoder portion described with reference to FIG. 1 by receiving input CPCM signals and providing output analog signals. If the input CPCM signals are those from the encoder, the output analog signal substantially corresponds to the input analog signal.

The input CPCM signals are received on a path 22', for example over a known T1 telephone line (not shown) from the path 22 in FIG. 1. The signals are first decoded from CPCM to LPCM signals in a CPCM to LPCM decoder 34 to provide lower speed LPCM signals, for example LPCM signals of a frequency corresponding to the 8 KHz frequency commercially used in telephone systems for CPCM signals.

The lower speed LPCM signals from the converter 34 are first converted into higher speed signals in a lower to higher speed converter 38. This converter 38 operates by repeating the input lower speed signals in sets of the higher speed signals, it then being apparent that, merely for convenient processing, the higher speed of the signals should be an integral multiple of the lower speed with the number of repeated lower speed signals forming a set of the higher speed signals being the multiplier integer. For example, in the later more precise description of the decoder with reference to FIGS. 6–9, the higher frequency is, for simplicity, twice the lower frequency, and each set of the higher frequency signals is therefore a repeated pair of the corresponding lower speed signals.

It being recalled that LPCM signals are in sign and magnitude format, each higher speed LPCM signal from the converter 34 is then converted for convenient processing from sign and magnitude format into two's complement format in a converter 36. These higher speed two's complement signals are then provided to a UFIR digital filter 39. The UFIR digital filter 39 then accumulates each successive higher speed signal with the preceding signal and averages the result to form average, higher speed LPCM signals. Since each signal within a set is the same, being a repeated one of the corresponding lower speed signal, the average of signals within one set will be the same as the averaged signals while the average of signals between succeeding sets, that is the last signal of one set and the first signal of the next set, will be an average of the last and first signals. The UFIR digital filter 39 thus functions to smooth or filter the transition between successive LPCM signals. This smoothing function reduces the waveform distortion of the reconstructed analog signal at the output of the decoder.

The average higher speed signals are then provided to a two's complement to offset binary signal code converter 41 which outputs offset binary signals corresponding to each of the input higher speed two's complement signals over path 40. These signals are carried on path 40 to a digital comparator 42 in a digital delta demodulator 43. The digital comparator 42 compares the signal on the path 40 with a binary-encoded digital signal on path 44 when strobed from a reversible or up-down counter 46 by a strobe signal on path 47 from a strobe clock (not shown). If the encoded signal on the path 40 represents a larger number than the encoded signal on the path 44, the digital comparator 42 provides a high logic level output signal on a path 48. If, on the other hand, the encoded signal on the path 44 exceeds that encoded on the path 40, the comparator provides a low logic level signal to the path 48. The signals on the path 48 are provided to the counter 46 to increment the counter with each high logic level signal and to decrement the counter with each low logic level signal. The counter 46 thus accumulates a total of the logic level signals output from the comparator 42 to locally generate the signal on path 44 to the comparator 42. It is to be noted that the described delta demodulator 43 is entirely digital. As with the counter 14 (FIG. 1) the counter 46 has means which generate a reset signal for coordinately resetting the counter 46 and, via path 49, integrator 50.

The logic level signals on the path 48 are thus recognized as LDM signals. These signals are also provided to the integrator 50 which integrates the digital LDM signals into an analog signal output over path 52. Through these encoding and decoding arrangements, the strobing speed of the signal on path 26 in the encoder shown in FIG. 1 and that on the path 47 in the decoder shown in FIG. 2 can be identical, so that the circuit design for the integrator 30 (FIG. 1) in the encoder can be identical to that of the integrator 50 (FIG. 2) in the decoder.

As the decoder just described with reference to FIG. 2 begins operation, it may be that the up-down counter 46 is initially at a count representing, in binary format, a number less than that represented by the signal on path 40. The signal on the path 44 from the counter 46 to the comparator 42 then is less than that on path 40 and the comparator 42 then provides a high logic level signal over the path 48 to the up-down counter 46 to increment the counter and increase the signal on the path 44 at the next strobe signal over path 47. The counter continues to thus increment toward the signal on path 40 until the total count in the counter exceeds the signal then on the path 40. Similarly, if the counter 46 initially provides a signal to the path 44 greater than that on the path 40, the counter will decrement until the counter output on path 44 reaches the level of the signal then on the path 40. Therefore, it is clearly desirable to have the frequency of the strobe signal input on path 47 exceed that of the signals on path 40.

MORE DETAILED DESCRIPTION OF THE ENCODER

FIG. 3 shows a portion of the encoder generally described above with reference to FIG. 1. The LDM input signals on the path 32 from the linear delta modulator 12 (FIG. 1) are shown in FIG. 3 as input into a 12 bit up-down counter 14 which counts each of the LDM signals received over the path 32. These accumulated LDM signals are examined at a 160 KHz rate, so that the logic speed for serial implementation of the filtering function will not exceed that of the highest speed clock in the system.

Merely for the convenience in the implementation of the following components, it is desirable to convert the binary encoded word signal accumulated from the successive LDM signals in the counter 14 into a two's complement format. Accordingly, the word signals accumulated in the counter 14 are clocked at a high rate, specifically 160 KHz, into a binary to two's complement converter 15.

From the binary to two's complement converter 15, the two's complement converted signals are clocked at the high, 160 KHz rate into an accumulator 62. Functionally, 16 consecutive signals are added together in the accumulator 62 and then divided by 16 in device 64 to form one signal at an average of the accumulated samples. This, then, is the UFIR digital filter 16 (FIG. 1).

Actually, however, from the 160 KHz signals input to accumulator 62 from converter 15, 20 signals are accumulated during the 125 microsecond period of one 8 KHz signal indicated as output after averaging at 64. For hardware simplicity, four of these signals are then ignored, leaving 16 useful accumulated signals. At the same time, actual division by 16 is unnecessary since it is but a shift of four bits in a signal encoded in a binary base such as the indicated two's complement format, ignoring, of course, the sign bit. Therefore, this indicated filtering operation on 16 signals may be performed by accumulating 16 input signals and sampling the result after the accumulation; this implementation is later described including reference to an additional signal truncation function.

The resulting 8 KHz signal is output over path 66 to the two's complement to sign-magnitude converter 18. This converter requires a separate indication of the sign of each signal which is provided over path 56 as later described. Converter 18 then provides 8 KHz LPCM signals in sign-magnitude format to converter 20 which changes the LPCM format to the CPCM format to provide an 8 KHz CPCM output signal to path 22.

FIG. 4 further illustrates the function of certain components also illustrated in FIG. 3. As earlier described with reference to FIG. 3, the LDM signals are accumulated in counter 14 to provide 12-bit LPCM output signals, the 12 bits being determined merely by the indicated capacity of counter 14. However, the binary to two's complement converter 15 is now shown in FIG. 4 to be a parallel transmission path 74 for each of the 12 bits from the counter and an inverter 72. The most significant bit (hereafter MSB) of the counter signal on path 74 is also provided to the inverter 72 which inverts the MSB.

Table I

| Number | Offset Binary | Two's Complement |
|--------|---------------|------------------|
| +3 | 1 011 | 0 011 |
| +2 | 1 010 | 0 010 |
| +1 | 1 001 | 0 001 |
| 0 | 1 000 | 0 000 |
| −1 | 0 111 | 1 111 |
| −2 | 0 110 | 1 110 |
| −3 | 0 101 | 1 101 |
|  | MSB | MSB |

It will be quickly seen from Table I that the difference between an offset binary encoding format and a two's complement format is that the MSB in the two's complement format is inverted from that in the offset binary format. At the same time, offset binary will be recognized as merely straight binary folded at number zero and with the MSB indicating sign, a format implemented by merely assigning number zero to the half-full state of counter 14. Accordingly, the inverter 72, by inverting the MSB from the counter 14, converts the offset binary signal from the counter 14 into a two's complement format signal. The inverted signal from inverter 72 is shown as being applied to 4 input ports of a parallel to serial converting shift register 76. The redundancy of the 4 signals from the inverter 72 to the shift register 76 is necessary for converting the 12 bit two's complement signal into a 16-bit two's complement signal. The 16 bit length is selected for avoiding addition overflow during the signal accumulation in filter 16 and for convenience in the design of the system. The shift register 76 converts the parallel input signal into serial format and provides the least significant bit first to an input port 80 of the UFIR digital filter 16.

The functional illustration of accumulator 62 and divider and truncation device 64 shown in FIG. 3 are shown in FIG. 4 to be the UFIR digital filter 16. An adder 82 in the filter 16 receives the least significant bit first signal at the port 80. The adder 82 also receives a signal at port 84 which is synchronized bit for bit with the signal from the shift register 76 at port 80 and represents the sum of the preceding signals as added in the adder 82. For this purpose the output of the adder 82 is provided over a path 86 to a 16 bit serial to serial shift register 88 and clocked through the shift register 88 and via path 89 to the port 84 at the same bit rate as signal bits arrive at port 80 from the parallel to serial shift register 76. These bits are then added, bit by bit, and the sum provided over path 86 to the shift register 88.

Since the adder 82 is operating upon binary base bits (in two's complement format) two 1 bits add to a number 2, a "10" signal in binary notation. The second bit must then be carried and added to the next bit. For this purpose each such carry-by bit is provided to a port 90 of the adder 82 and delayed one bit in a device 92 and then reintroduced into the adder 82 at a port 94 for addition with the bits then input at the ports 80 and 84.

The output from the shift register 88 on path 89 is also provided to the two's complement to sign-magnitude converter 18 through an AND gate 96 when the gate is periodically enabled with an enable signal on a path 98 to the AND gate 96, all as more precisely described with later reference to FIG. 5A. As earlier described with reference to FIG. 3, the signals from the converter 18 are then transformed into a CPCM signal by a converter 20 for output over the path 22.

SCHEMATIC OF THE ENCODER

Figure 5:
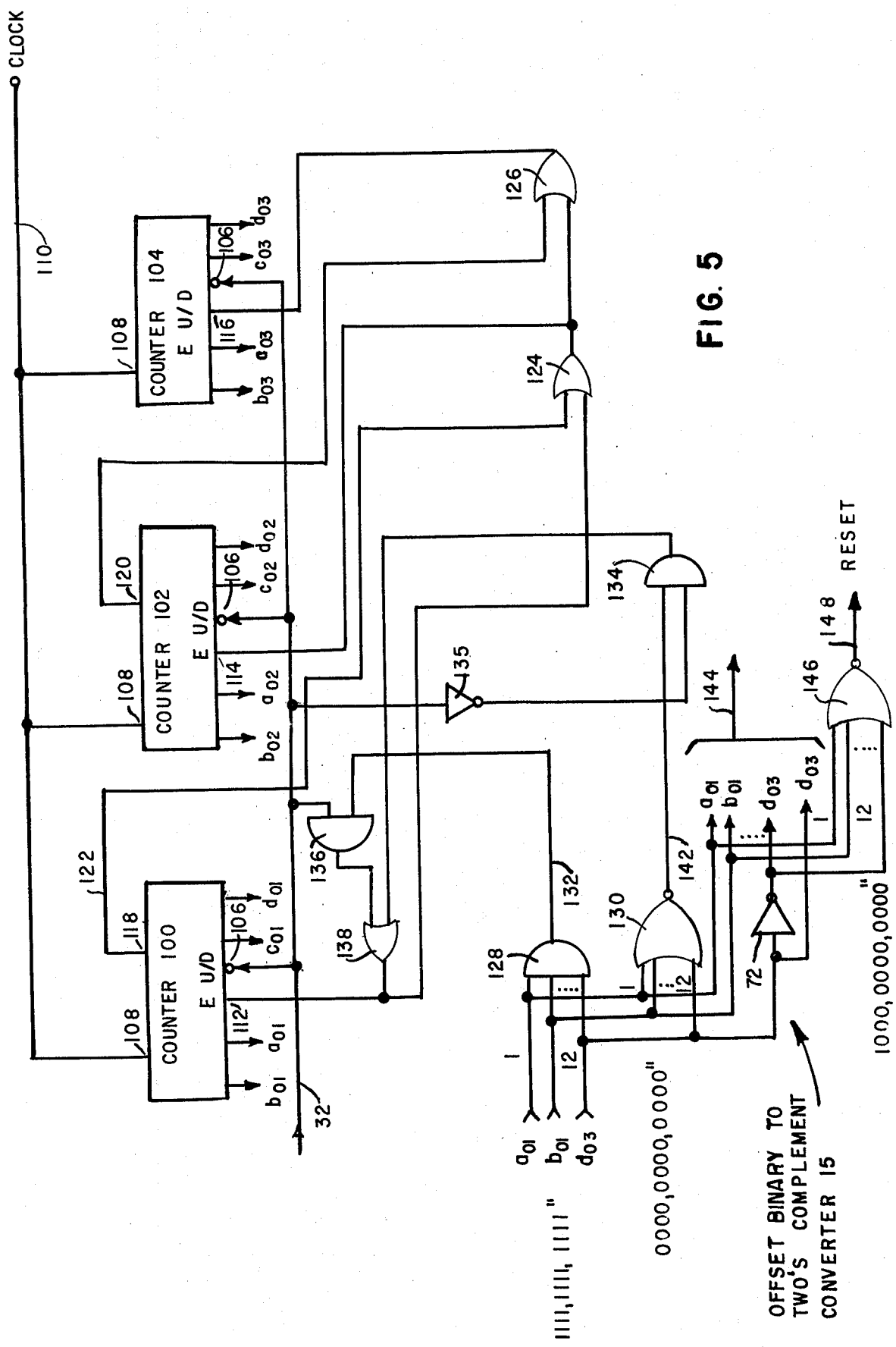
FIGS. 5 and 5A are schematics of the encoder portion shown in FIG. 4.
Figure 5A:
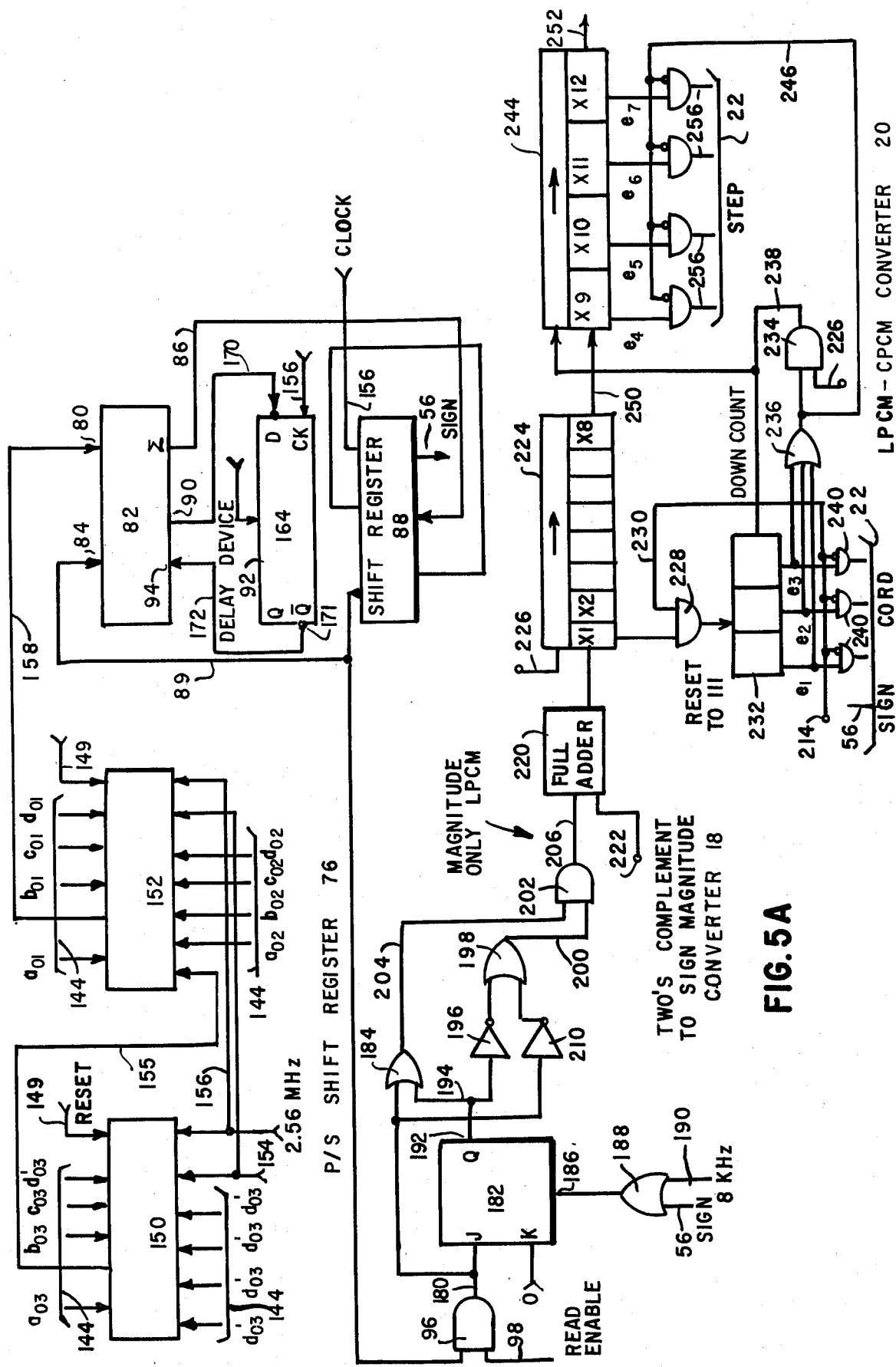

FIGS. 5 and 5A show detail of the encoder embodiment more generally described with earlier reference to FIGS. 1, 3 and 4. The 12-bit up-down counter 14 is now seen to be composed of three 4-bit counting devices 100, 102 amd 104 each of which may be of a type designated SN74191 and commercially available from Texas Instruments Corporation. Each counter has an input port 106 connected to the path 32 for receiving the successive LDM signals and, when properly enabled, incrementing for each high logic level LDM signal and decrementing for each low logic level LDM signal.

To operate each of the counter devices 100, 102 and 104, each device has a clock input port 108 receiving a clock signal on path 110 from a clock (not shown). The clock signals are at the frequency of the LDM signals, 8 MHz as described with reference to FIG. 3, to clock each LDM signal on path 32 into the counters 100, 102, 104. In addition, each counter device 100, 102 and 104 has a port 112, 114 and 116, respectively, for selectively disabling the corresponding counter device from responding to the signals on the path 32. Counter 100 also has a port 118 connected over path 122 through OR gate 124, to the disable port 114 of the counter device 102, and, through OR gate 126, to the disable port 116 of the counter device 104. A port 120 of counter device 102 is similarly connected through OR gate 126 to the disable port 116 of counter device 104. The disable port 112 of the counter 100 is connected to other, later described devices.

Assuming, for the moment, that the counter device 100 is neither full nor empty nor disabled by a signal at port 112, each clock signal at port 108 enables the device to respond to the corresponding LDM signal on path 32, that is, to increment in response to a high logic level LDM signal and decrement in response to a low logic level LDM signal. At the same time, device 100 provides a signal from port 118 on path 122 and through OR gates 124, 126 to the disable ports 114, 116 of counter devices 102, 104 which disables these devices 102, 104 from responding to the LDM signal on path 32. When counter 100 fills, that is provides all logic 1 signals to its parallel output paths ao1-do1, and the next LDM signal on path 32 is of a low logic level, the device 100 decrements to provide a "1110" signal to its output paths. However when counter 100 fills and the next LDm signal is of a high logic level, the signal at the port 118 changes state and is carried on path 122 to the port 114 of counter device 102 to now enable device 102 to respond to the LDM signal. Of course, the signal from port 120 of counter device 102, like that formerly from port 118 of counter 100, continues to provide a disabling signal to port 116 of counter device 104 until counter device 102 also fills and the next LDM signal requires a further counter increment.

If and when each counter device 100, 102, 104 fills, each of the separate output paths ao1-do3 from the counter devices will carry a logic 1 signal, the ao1 output path carrying the least significant bit and the do3 output path carrying the most significant bit. Each of these output paths is connected to input ports of AND gate 128. The AND gate 128 then responds to the logic 1 signals at each of its input ports with a logic 1 signal to an output path 132. This logic 1 signal on path 132 is applied through AND gate 136 and OR gates 138, 124, 126 to the disable ports 112, 114, 116 of the counter devices 100, 102, 104 if the next LDM signal on path 32 is high logic level to enable AND gate 136 which is also connected to path 32. Each counter device 100, 102, and 104 is then disabled from incrementing in response to the signal on path 32 by the logic 1 signal from AND gate 128. On the other hand if the next LDM signal on path 32 is of low logic level, AND gate 136 will be disabled and the logic 1 signal on path 132 is interrupted at AND gate 136, hence counter devices 100, 102, and 104 are enabled for down-counting in response to the signal on path 32. The counter 14 is thus prevented from overflowing until a low logic level LDM signal arrives on path 32 to down-count the counter.

Each of the counter output paths ao1-do3 is also connected to NOR gate 130. This gate responds only to logic 0 signals on each path ao1-do3 to provide a logic 1 on a path 142 to AND gate 134 which is also connected to the path 32 through an inverter 135. AND gate 134 then provides a logic 1 signal through OR gate 138 to provide an inhibit signal to freeze the logic 0 output signals on paths ao1-do3 from counters 100, 102, 104 only when the next LDM signal on path 32 is of low logic level otherwise requiring further decrement of the counter. Then, in similarity with the full count signal from AND gate 128 just described, this logic 1 signal on path 142 from NOR gate 130 disables each of the counter devices 100, 102, 104 while the gate 134 and OR gate 138 permits the device 100 to respond to a next high logic level signal on path 32 when such a signal occurs.

In review, a logic 1 on each of the output paths ao1-do3 from the counter devices 100, 102, and 104, triggers a signal from gates 128, 136, 138 which, only if the next LDM signal on the path 32 should be a high logic level signal which would otherwise increment one of the counter devices 100–104, freezes the counter devices from responding to the LDM signal but enables them to receive a low level LDM signal which decrements the counter devices 100–104 from their full logic 1 state. If the counters were to overflow each output would change from a logic one to a logic zero which is the maximum possible error of the counter. Accordingly, the freezing of the counter 100, 102, 104 from further up-counting assures that this maximum error will not occur. Similarly, if the counters 100, 102, 104 reach their full zero count, the gates 130, 134, 135, 138 are satisfied to disable the counters only from further decrementing in response to a next low logic level LDM signal and thus freeze the counters in their all zero state.

The signals from the counters 100, 102 and 104 on paths ao1-do3 are also provided to the offset binary to two's complement converter 15. This converter, again shown to be composed of inverter 72, inverts the signal on the path do3 representing the MSB from the counters 100–104 to provide a signal to a path do3'. This code conversion has already been described with reference to FIG. 4 and Table I. The converter then provides output signals representing each of the 12 bits from the counter on the continuing paths ao1-do3 and the inversion of the MSB on path do3, these paths being collectively indicated at 144.

The converter 15 is seen to additionally comprise NOR gate 146 which is connected to each of the output paths from the counter 14, except do3, and is additionally connected to the output path do3' from the inverter 72. Gate 146 is thus satisfied when the MSB signal from the counter 14 on the path do3 is a logic 1, inverted to a logic 0 in inverter 72, and each of the other signals on the output paths from the counter 14 is a logic 0 thereby representing the half-full state of the counter 14. The output logic 1 signal on path 148 is used as a reset signal because it represents the zero state of the accumulated LDM signals in offset binary format. Accordingly, it is now clear that the counter 14 may be thought of as operating in an offset binary format in which the half-full state of the counter corresponds to zero and the maximum and minimum counts of the counter 14 correspond to positive and negative full scale counts, respectively. The reset signal on the path 148 from gate 146 is provided on path 15 to the integrator 30 in the linear delta modulator 12 shown in FIG. 1. This signal to the integrator 30 resets the integrator to zero, corresponding to the encoded format of the zero count then in the counter 14, to assure that the zero state of the integrator 30 corresponds with the count in the counter.

Continuing with the description of FIG. 5A, each of the signals from the converter 15 is carried on the paths 144 to corresponding input ports of the parallel to serial shift register 76, it being noted that 16 bits are provided to the shift register, the signal on path do3' being provided to four ports of the register 76 as also shown in FIG. 4. The shift register 76 is seen in FIG. 5A to be composed of two units 150 and 152 connected in sequence over a path 155. Units 150, 152 are of a commercially available type, for example type SN74165 available from Texas Instruments Incorporated.

Each of the shift register units 150, 152 receives a periodic reset signal on a path 149 from a clock (not shown) to reset each bit in the shift register between LPCM signals. They also receive a clock input over a path 154 from a clock device (not shown) which enables the shift register units to accept the signals on each of the parallel input paths 144. In the preferred embodiment the enabling signal on the path 154 has been described with reference to FIG. 3 as occurring at 160 KHz which, in relation to the 8 MHz frequency of the LDM signals on path 32 (FIG. 3), indicates as accumulation of 50 LDM signals in the counter 14 for each counter signal advanced into the shift register 76.

Each of the shift register units 150, 152 also receives an input signal on a path 156 from a clock (not shown) which shifts the data bits input from the paths 144 through the shift register and, in serial fashion, along an output path 158 in the order of their bit significance from the least significant signal input on the path ao3 of the paths 144 to the MSB signal input on the path do3' of the paths 144, followed by the four bits received from the path do3'. As is well understood with such parallel to serial shift registers, the frequency of the clock signal on path 156 for shifting the data bits through the register must shift each of the 16 data bits through the register in the interval between the parallel input loading clock signals on the path 154. Since the frequency of the signals on the path 154 has been determined to be 160 KHz and since there are 16 bits of the data, the frequency of the clock signals on the path 156 will be 2.56 MHz. The signals output on the path 158 will then have a 2.67 MHz bit frequency within word signal segments of 160 KHz representing successive words from the counter 14 each of which differs by LPCM sample of 50 LDM input signals.

The signals on the path 158 are provided to the UFIR filter 16 at the input port 80 of the adder 82 earlier described with reference to FIG. 4. This adder may be a device designated SN7480 and commercially available from Texas Instruments Incorporated. The adder also has the input port 84 receiving signals from the register 88. The register 88 may be a device commercially designated AM9328. The adder also receives signals at the port 94. These signals at each of the ports 80, 84, 94 of the adder 82 are added, bit by bit, to form an output signal carried over a path 86 to the register 88.

If two of these ports receive logic 1 signals, a carry function is necessary. A carry signal is then provided from port 90 over path 170 to delay device 92 now shown to be a flip-flop 164. The flip-flop 164 also receives the 2.56 MHz clock signal over the path 156 to provide the carry signal synchronously with the signal bits at port 80 and at a proper rate. The signals from output port 171 are a logic 0 for each logic 1 received over the path 170 but delayed one bit from their input over path 170. These signals are provided over a path 172 to the port 94 of the adder. Of course, it is easily understood that even if each of the input ports 80, 84 and 94 of the adder 82 simultaneously receive logic 1 signals, these signals may be added to form a 3 signal, 11 in binary code, which will simultaneously trigger the carry signal on the path 170 and a logic 1 signal on the path 86. Accordingly, only one carry bit through the flip-flop need be provided.

The register 88 operates as a shift register. It also receives the clock signal over the path 156 and responds to this clock signal to shift the bits of data one bit-place through the register. The register has 16 bit-places to synchronize the places of the bits output over path 89 with the bit places of the signal words on the path 158. That is, at the beginning of each of the 160 KHz word signals on the path 158, the first bit of this word arrives at the port 80 coincidentally with the first bit of the accumulated word signals from the register 88 on path 89.

The signals on the path 89 are also provided to AND gate 96. AND gate 96 receives an enabling signal on a path 98 from a clock device (not shown). This signal enables the gate for an interval corresponding to the last 14 bits of the accumulated 160 KHz, 16-bit word signal on the path 89 in each of successive 125 microsecond periods defining an 8 KHz signal. Accordingly, the output from the AND gate 96 on a path 180 will be a 14-bit data word having a bit frequency of 2.56 MHz and a word frequency of 8 KHz. The performance of dropping the last two bits of the accumulated sum is functionally equivalent to dividing the signal by sixteen followed by a 2-bit truncation of the signal as indicated at 64 of FIG. 3. It is to be understood that the number of bits to be truncated is determined by the accuracy of data required; 14-bits are selected here to match the compression accuracy requirement of commercial telephone devices, for example a D2 unit. Thus the LPCM signals on output path 180 have now been converted to the desired 14-bit 8 KHz signals for compatibility with commercial telephone systems.

The signals on the path 180 are provided to the two's complement to sign-magnitude converter 18. The operation of this converter 18 will be best understood with combined reference to FIG. 5A and Table II.

Table II

| Number | Two's Complement | Sign-Magnitude |
|---|---|---|
| +3 | 0 011 | 0 011 |
| +2 | 0 010 | 0 010 |
| +1 | 0 001 | 0 001 |
| 0 | 0 000 | 0 000(1000) |
| −1 | 1 111 | 1 001 |
| −2 | 1 110 | 1 010 |
| −3 | 1 101 | 1 011 |
|  | Sign bit | Sign bit |

From Table II it is seen that each sign-magnitude format signal corresponding to a positive number is the same as the two's complement format signal representing the same positive number. For example, a +3 is represented by a 0 011 signal in two's complement format and the same 0 011 signal in sign and magnitude format. However, for negative numbers, the two's complement and sign-magnitude codes are seen to differ. Careful study of the differences in the code formats will reveal that the bits in each format representing the same negative number are the same through and including the first one, reading from right to left in Table II, and inverted thereafter, ignoring the sign bit in both the two's complement and sign-magnitude formats which are the same. The converter 18 implements these observations.

In the converter 18, each signal on the path 180 is provided to a flip-flop 182 and an OR gate 184. The flip-flop 182 receives a reset signal at a port 186 from an OR gate 188. The OR gate 188 receives high logic level 8 KHz clock signals on an input path 190 from a clock (not shown). These clock signals are synchronized to the 8 KHz LPCM signal words on the path 180 to reset the flip-flop 182 at the beginning of each LPCM signal on the path 180 from gate 96. When reset, flip-flop 182 provides a logic 0 signal to an output port 192.

In addition, the OR gate 188 receives a signal on a path 56 which represents the most significant bit in the register 88 and, in the two's complement format, is shown in Table II to be a logic 0 for a positive number. Then, so long as the number in the register 88 is positive, the signal input to the flip-flop 182 at port 186 from path 56 through gate 188 will be a logic 0 holding the flip-flop 182 in its reset condition with a logic 0 at port 192.

The logic 0 signal at the port 192 is carried on a path 194 to an inverter 196, and the resulting logic 1 signal from the inverter 196 is provided to an OR gate 198. OR gate 198 then provides a logic 1 signal on a path 200 to an AND gate 202. AND gate 202 is then enabled. AND gate 202 also receives on a path 204 the signal on the path 180 through OR gate 184. Since AND gate 202 is enabled by the logic one signal on path 200, each bit of the signal on the path 180 is effectively carried through AND gate 202 to an output path 206 from AND gate 202. Thus, each signal representing a positive number on the path 180 is effectively carried to the output path 206. This operation clearly corresponds to the identity between the two's complement format and sign-magnitude format shown in Table II for representing positive numbers.

If, on the other hand, the signal on the path 180 results from a negative number in register 88, the signal on path 56 is seen, with reference to Table II, to be a logic 1. This logic 1 signal, applied to port 186 of the flip-flop 182 through OR gate 188, does not hold the flip-flop in its reset condition established by a logic 0 clock signal input from path 190 through OR gate 188 at the beginning of the signal word from a clock device (not shown). The signal on the path 180 is applied to a port J of the flip-flop 182 but does not change the state of the flip-flop at the output port so long as each input bit to the flip-flop on path 180 is a logic 0. However, when the data bit is a logic 1 to the port J, the signal output from the flip-flop 182 at port 192 changes state to provide a logic 1 signal from the output port 192. It is specifically noted that since the flip-flop 182 complements on the trailing edge of the bit input to the port J on path 180, this bit on the path 180 will reach the OR gate 184 and AND gate 202 before the signal at the port 192 changes to a logic 1 state. Port 192 will then remain at a logic 1 until a next of the 8 KHz reset command signals is provided over path 190.

When the logic 1 does appear at the port 192, it is carried on the path 194 to inverter 196 where it becomes a logic 0 which, as carried through OR gate 198 and on path 200 to AND gate 202, will not enable AND gate 202. It also provides a logic 1 on path 204 through gate 184. The signal on the path 180 is also carried to an inverter 210. Then, if a bit of the signal on the path 180 is a logic 1, inverter 210 forms a logic 0 which is provided to OR gate 198 and over path 200 to AND gate 202. AND gate 202 is then not enabled and will provide a logic 0 corresponding to the logic 1 on the path 180. If, on the other hand, the signal on the path 180 is a logic 0, inverter 210 forms a logic 1 which, upon being carried through OR gate 198 and on path 200 to AND gate 202, enables the gate 202.

Reviewing this operation of the converter 60 for a negative number as indicated by a logic 1 signal on the path 56, port 186 becomes high and it is seen that each bit of the signal on the path 180 is output on the path 206 through and including the first logic 1 bit on the path 180. The first logic 1 bit is provided to the output path 206 only because the flip-flop 182 does not change state at its output port 192 until the trailing edge of the signal on the path 180. After the first logic 1, however, the flip-flop 182 does change state to maintain a logic 1 signal at the output port 192 until a next reset signal arrives on path 190. It is then seen that each subsequent logic signal on the path 180 is inverted on output path 206. This operation is precisely that described for converting a two's complement signal to sign-magnitude signal in which each bit from right to left in Table II through and including the first logic 1 is copied and each bit thereafter is inverted, ignoring, of course, the sign bit.

The resulting sign-magnitude format signals on the path 206 are then, in reality, magnitude only LPCM signals and the sign bit which corresponds to the format must be separately provided. Reference to Tables I and II shows that the sign bit in sign-magnitude format corresponds to that in two's complement format. This sign bit is, it will be recalled, represented by the MSB in the register 88 which is output over path 56. Accordingly, the LPCM to CPCM converter 20 receives the LPCM magnitude signal on the path 206 and a sign bit signal from the MSB of the register 88 on path 56.

Converters for converting LPCM to CPCM signals are generally known. Accordingly, a brief description will suffice. It should be noted, however, that the magnitude signal presented to the LPCM to CPCM converter 20 on the path 206 could contain all 16 bits of the signal from filter 16 only the last 14 being used. It is also noted that this number of 14 useful bits was selected merely for specific application to 8 bit D2 format compression, other bit numbers being useful in other converters 20 depending on the required bit accuracy.

One known type of LPCM-CPCM converter (not shown) would include a 14-bit serial to parallel shift register providing, in parallel format, the 14 bits of the LPCM signal magnitude to a $2^{13} \times 8$ read only memory storing the appropriate code conversion for converting the 13 bits of the LPCM signal into 7-bits of a CPCM signal and adding an 8th bit representing the sign of the LPCM-CPCM signal as received over path 56. Such 8-bit CPCM signals are in common use in telephone systems.

However, FIG. 5A shows another LPCM to CPCM converter, the theory of operation of which is disclosed in the above cited article of Kaneko. The 14-bit LPCM signal words on the path 206 are then provided to an adder 220. The adder 220 adds a constant number to this LPCM magnitude signal from path 206. This constant may be stored in a cyclic shift register (not shown). The constant depends upon the particular CPCM encoding scheme, mu-law and A-law encoding schemes having been earlier mentioned as commercially useful in telephone systems. The constant is composed of a number representing the number of quantizing steps in each chord, a parameter determining the origin of the chords and an edge effect parameter describing the discontinuity of step sizes between adjacent chords; for example, the constant is 16.5 for a mu=255 encoding scheme. In appropriate binary format, this constant is provided to adder 220 over path 222 for bit by bit addition to the signal input to the adder 220 over path 206.

The added signals from the adder 220 are then provided to a first shift register 224 which also receives on a path 226 a clock signal from a clock (not shown) which shifts the bits through the register from a bit storage place X1 toward a bit storage place X8. The clock signals on the path 226 must have a frequency of at least 8 KHz times the 14 bits of the input signal or 112 KHz for 8 bit mu=255 format, but preferably is 2.56 MHz to directly accept the signal of similar bit frequency on path 206. Each logic 1 bit in the bit place X1 is provided to an AND gate 228 which, when enabled by a signal on path 230, provides a logic 1 reset signal to a down counter 232 to reset the signal on each of three parallel output paths $e1$, $e2$, $e3$ of the counter 232 to a logic 1 state.

The clock signal on the path 226 is also provided to an AND gate 234 which also receives a signal from OR gate 236 connected to each of the output paths $e1$, $e2$, $e3$ of the down counter 232. When gate 236 provides a logic 1 signal, the clock signals are output from the gate 234 on a path 238 to down-count the counter 232.

Each of the output paths e1, e2, e3 from the binary down counter 232 also provide signals to one of AND gates 240 which are enabled by a logic 0 control signal on path 214 from a control clock (not shown) which occurs after the 13th bit of the signal input to the register 224 on a path 218 from the adder 220 and thus the time when the MSB has just arrived at the bit place X1 in the shift register 224. The AND gates 240 then provide a signal corresponding to the count then stored in the binary counter 232 which represents a number identifying the chord or segment of the CPCM signal. The chord number is then read out at the 14th bit time slot via an enabling control signal on the path 214.

The control signal on path 214 at the 14th bit is also provided via path 230 to AND gate 228 to disable the AND gate 228 from responding to further logic 1 bits in the bit place X1 of shift register 224 with a signal resetting down counter 232 to its full logic 1 state. The clock signals from the path 226 through AND gate 234 and then on path 238 to the binary counter 232 then continue to down-count the counter 232 until the counter reaches zero on each parallel output path $e1$, $e2$, $e3$ thereby providing all logic 0 signals to OR gate 236 and a disabling logic 0 signal to AND gate 234. The clock signals on the path 226 to shift register 224 have, in the meantime, shifted the data bits from shift register 224 via path 250 into another shift register 244 and, via path 238, through register 244 from a bit place X9 toward a bit place X12, one bit place per clock signal. Data bits from bit place X12 are discarded via path 252. When the signal from OR gate 236 drops to zero, it is also carried on a path 246 to enable AND gates 256 connected, respectively, to each bit place in the shift register 244 by output paths $e4$, $e5$, $e6$ and $e7$ from the shift register 244. The signals then output from the AND gates 256 represent the step on the chord previously identified from AND gates 240. Appropriate buffer means (not shown) store both signals output from AND gates 240 and 252. An 8th bit representing the sign is directly provided from the MSB of the register 88, the signal on the path 56. Accordingly, a 7 bit plus one sign bit CPCM signal has been provided to output path 22.

MORE DESCRIPTION OF THE DECODER

FIG. 6 shows a more detailed block diagram of the decoder generally described with reference to FIG. 2. The input CPCM signals on the path 22' as, for example, from the path 22 of the encoder just described, are first provided to the CPCM to LPCM converter 34 at, for example, the 8 KHz frequency used in commercial telephone systems. The converter repeats the output LPCM signals at a higher frequency which preferably is an integral multiple of the input frequency, for example 16 KHz. This function, separately indicated at 38 (FIG. 2), is now indicated as an output function of converter 34. The 16 KHz LPCM signals comprised of 13 serial data bits and a sign bit are then provided to the sign magnitude to two's complement converter 36 which converts the sign-magnitude format of the LPCM signals into a two's complement format.

From the sign-magnitude to two's complement converter 36, the signals are provided to a two sample accumulator 304 which adds each successive LPCM signal to the preceding LPCM signal. Since each signal is added to the preceding signal, the output signals from the accumulator 304 continue at the 16 KHz frequency, but now contain 15 bits, the additional bit resulting from the two-sample accumulation. Each of these 16 KHz, two-sample LPCM signals are then divided by two to form an average signal. As will later be more precisely described, the resulting signals will be seen to form alternate signals representing first an LPCM signal actually received and then a signal representing the average of two consecutively received LPCM signals. It will immediately be appreciated that the functions indicated at 304, 306 (FIG. 6) are those of the UFIR digital filter 39 (FIG. 2) and that other combinations of this filter technique may include providing the LPCM signals at a frequency other than twice that at which they are received and accumulating and averaging numbers of the received signals other than the described two, this embodiment being selected as the simplest implementation of the concept of the invention. The averaging, or filtering with the UFIR digital filter is required for avoiding waveform distortion of the analog waveform ultimately reconstructed from the LPCM signals.

The resulting 16 KHz, averaged LPCM signals are then provided to a serial to parallel shift register 308 which converts the serial format of the LPCM signals into a parallel format. It will additionally be noted that the serial to parallel shift register 308 contains only 12 bits of information. This 3-bit change from the 15 bits of the input signal may be thought of as performing signal scaling by truncation as indicated at filter 39 (FIG. 2). Three bit truncation is performed to simplify the implementing hardware for the blocks 41, 310, 42, 46 following the shift register 308. Selection of the 12-bit length for block 46 is also convenient since the signal then has the same length as that from the counter 14 (FIG. 1) of the encoder; therefore, the same minimum analog signal step can be used for the encoder and decoder integrators 30 (FIG. 1), 50 (FIG. 2) and the integrators may be of the same design, as earlier described.

The parallel signals from the register 308 are provided to a shift and hold device 310 which merely holds or extends each of the received serial pulses for the full period of each 16 KHz signal and then to the two's complement to offset binary converter 41 which, as already described, changes the format of the LPCM signals to offset binary. The offset binary, parallel LPCM signals are next provided to a 12-bit parallel, digital comparator 42 which compares each bit of the input signal with a 12-bit parallel input signal on parallel paths 314 corresponding to path 44 (FIG. 2) from a 12 bit up-down counter 46. The signals are compared at an 8 MHz strobe frequency input to the counter 46 over the path 47 from a clock (not shown). From the indicated frequencies, it will be seen that 500 comparisons of each LPCM signal are made with the signals in the up-down counter. However, the 8 MHz strobe frequency for the digital comparator has been selected merely to correspond to the strobe frequency originally selected for the linear delta modulator 12 shown in FIG. 1. In this way, the integrator 50 shown in FIG. 2 may be the same as integrator 30 shown in FIG. 1 as earlier described.

If the number represented by the LPCM signal in the comparator 42 exceeds that in the up-down counter 46, the digital comparator outputs a high logic level signal. If, on the other hand, the number in the comparator 42 exceeds that in the counter 46, a low logic level signal is output. These output signals on a path 48 are counted in the up-down counter 46 to increment the counter in response to each high level logic signal and decrement the counter in response to each low logic level signal. The resulting high and low logic level signals on the path 48 will be recognized as LDM signals which, as shown in FIG. 2, may be provided to an integrator 50 for conversion into an analog signal. Of course, where an analog signal was originally input over the path 10 to form the CPCM signals on the output path 22 of the encoder shown in FIG. 1 and the encoder path 22 is coupled to the input path 22' of the decoder, the analog output from the integrator 50 will substantially correspond to the input analog signal.

MORE DETAILED DESCRIPTION OF THE DECODER

FIG. 7 again shows the input path 22' carrying 8 KHz CPCM signals to CPCM to LPCM converter 34. The 16 KHz LPCM signal output from the converter 34 is provided to the sign-magnitude to two's complement converter 36 which is now shown in detail. This converter will immediately be recognized as identical with that described with reference to FIG. 5A as the two's complement to sign-magnitude converter 18. A review of Table II above will reveal that the sign-magnitude signal format is identical with the two's complement code for positive numbers, and, for negative numbers, the same through and including the first one, with each bit thereafter inverted except, of course, the sign bit. This will be recognized as precisely the requirements for the two's complement to sign-magnitude converter 18. Therefore the implementation of the converters 36 (FIG. 7) and 18 (FIG. 5A) is also the same and the reference characters applied to the components of the sign-magnitude to two's complement converter 36 shown in FIG. 7 correspond to those used to identify similar components of converter 18 shown in FIG. 5A. At the same time, no further description of this converter should be necessary. It is, however, noted that the frequency of the clock signal to OR gate 188' on path 190' is now at 16 KHz; however, the function of the OR gate 188' remains the same as earlier described OR gate 188 (FIG. 5A). It is also noted that the sign bit is introduced to OR gate 188' over a path 322 from the CPCM to LPCM converter 34 instead of the MSB of the register 88 on path 56 shown in FIG. 5A. Again, however, the function of the sign bit is the same as that described with reference to FIG. 5A.

Then, from the converter 36, the LPCM signals in two's complement format are provided to a device 324 which adds the sign bit supplied on the path 322 from the converter 34 as a discrete bit of each LPCM signal. The LPCM signals including the sign are then provided from device 324 to paths 326 and 328. The signals on path 326 are carried to a serial to serial shift register 330 forming, together with an adder 332 and a connected delay device 334 the two sample accumulator 304 (FIG. 6). Each bit of the signal on path 326 is clocked through the shift register 330 at a frequency such that the first bit of the input signal arrives at an output port 336 of the shift register at the same time as the first bit of the next LPCM signal from the device 324 arrives on the path 328. The signal from port 336 and that on the path 328 are provided to the adder 332. The adder 332 adds each bit of the signal from the port 336 to the signal on the path 328 to provide a total signal to an output path 340. When necessary the adder provides a carry bit to a path 342 which is delayed 1 bit in device 334 and reintroduced into the adder at a port 344. The register 330, adder 332 and delay device 334 are thus seen to be connected in an arrangement like that of filter 16 described with reference to FIGS. 4 and 5A. Since the components are similar to those earlier described, only limited further description of the accumulator 304 of the UFIR digital filter 39 need be provided.

In the operation the accumulator 304, it wll be understood that logic 1 MSB signals in two succeeding LPCM signals will add to a binary-encoded two to require the additional 15th bit indicated as input to the serial to parallel shift register 308 which receives the output of the accumulator 304 over path 340 and which, in addition to providing parallel output signals, simultaneously performs the division by two and signal truncation indicated in devices 306, 308 of FIG. 6. The averaged, accumulated LPCM signals are then provided in parallel format to the 12-bit shift and hold register 310 which performs the signal stretching or holding function described for the register with reference to FIG. 6.

The MSB in the shift and hold register 310 is provided to a path 346 leading to the two's complement to offset binary converter 41 while the remaining bits are provided on parallel paths 348 leading directly to the digital comparator 42. A review of Table I will quickly indicate that a two's complement format signal is identical with an offset binary encoded signal with the exception of the MSB which is inverted in the offset binary format from that of the two's complement format. Then, just as described with reference to FIG. 4 for the offset binary to two's complement converter 15, the two's complement to offset binary converter 41 comprises an inverter 350 inverting the MSB signal on the path 346 and providing the inverted signal to an appropriate input port of the digital comparator 42. The digital comparator 42 is again shown as receiving parallel input signals on parallel paths 314 from an up-down counter 46 which is responsive to the high and low logic signals output from the comparator 42 onto the path 48.

SCHEMATIC DESCRIPTION OF THE DECODER

Figure 8:
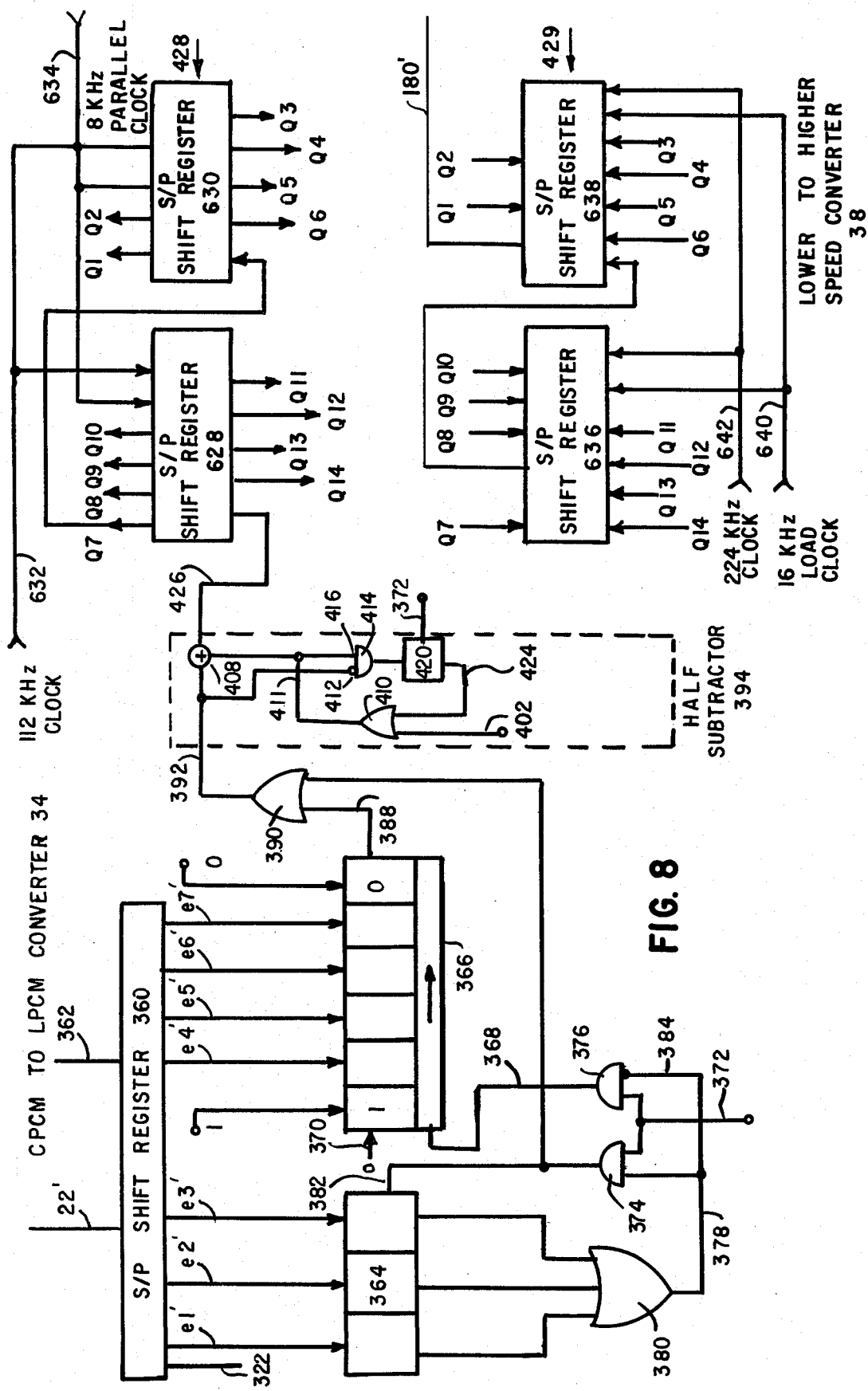

Turning now to FIG. 8, the CPCM to LPCM converter 34 could be implemented by an embodiment having a serial to parallel shift register 360 receiving the serial CPCM signals on path 22' and providing corresponding parallel output signals to a $2^7 \times 13$ read only memory device (not shown). The read only memory device is preset with a table giving output LPCM signals from the device which correspond to each input CPCM signal and a discrete port (not shown) carrying the sign of the corresponding signal to path 322 described with reference to FIG. 7.

However, FIG. 8 shows the parallel CPCM signals from serial to parallel shift register 360 as being provided to an embodiment of CPCM to LPCM converter 34 the theory of operation of which is described in the above referenced article by Kaneko. The CPCM signals on the input path 22' are then first provided to the serial to parallel register 360 which also receives a clock signal over a path 362 from a clock (not shown) at a frequency corresponding to the input frequency of the CPCM signals, here 8 KHz. In the illustrated embodiment, the CPCM signal is assumed to be composed of seven bits and an eighth sign bit, three bits of the seven bits indicating the chord of the CPCM encoding scheme and four bits indicating the step on the chord. As indicated, the sign bit is directly withdrawn from the register 360 onto the path 322. Since the CPCM encoding scheme corresponds to that just described with reference to FIG. 5A as the output of the converter 20, the three bits representing the chord of the CPCM encoding scheme are provided over paths e1', e2', e3', identified in correspondence with the output paths shown in FIG. 5A. The signals on these paths are provided to parallel input ports of a 3-bit down counter 364.

The four bits representing the step magnitude of the CPCM signal are provided over paths e4', e5', e6' and e7' to parallel input ports of a shift register 366. The shift register 366 also receives a first zero bit in a bit place correspondingly marked with a zero and a last logic 1 bit in the last bit place indicated with a logic 1. As later described, the shift register 366 also receives a clock signal over a path 368 which shifts the data bits in the register to the right. An additional input 370 to the shift register 366 places a logic 0 in each bit place as the bits in the shift register are shifted to the right. In addition, the converter 34 receives logic 1 signals on paths 372, 402 from clocks (not shown).

The clock signals on the path 372 are provided to AND gates 374 and 376. The AND gate 374 also receives the signals on a path 378 from an OR gate 380 receiving parallel output signals from the down counter 364. Then, until each output signal from the down counter 364 reaches zero, the OR gate 380 will provide a logic 1 signal to the gate 374 which, together with each logic 1 signal from the clock on path 372, will cause gate 374 to provide a signal on path 381 to a port 382 of the down counter 364 to down count the counter one bit from its original state as input over paths e1', e2', e3'. The signal on the path 378 is also inverted at an input port 384 of the AND gate 376 so that this AND gate is not satisfied by the logic 1 clock signals on path 372 until the down counter 364 reaches a full zero count.

Then, the down counter 364 begins to count down from its preset count determined from the signals originally input on paths e1, e2, e3, until it reaches full zero. Since the maximum binary count of the three bits input to the counter over the paths e1', e2', e3' is 111 in binary notation or number seven, the maximum number of bits output from the counter 364 through OR gate 380 to path 378 is seven bits and when the counter 364 reaches full 0, the resulting zero signal on the path 378 from OR gate 380 disables the AND gate 374. Gate 374 then ceases to provide clocked signals on path 381 for down counting the counter ending the serial logic 1 signals on path 381 which also carries them to later described OR gate 390. At the same time, the logic 0 signal then on the path 378 enables AND gate 376.

AND gate 376 is then satisfied by each logic 1 clock signal on the path 372 to provide corresponding logic 1 signals on the path 368 to the shift register 366. The shift register 366 then successively shifts the signal bits in the register via an output path 388 to the OR gate 390. Since the shift register 366 is not clocked by the signals from gate 376 until the counter 364 reaches a full zero count and the counter 364 then disables gate 374 from providing signals to the path 381, the signals on paths 381 and 388 do not overlap in time but are in serial sequence, the signals on the path 381 occurring first to be followed by those on the path 388.

The resulting serial signals from OR gate 390 are provided on a path 392 to a half subtractor device 394. The half-subtractor device 394 also receives a logic 1 signal on a path 402 from a clock (not shown) at the fifth data bit of the signal input over path 392. The function of the half-subtractor is to subtract a constant, 16, from each signal input on path 392 to form the LPCM signal then output on path 426.

To this end the half-subtractor 394 receives the successive data bits on path 392 in a half-adder 408 which also receives signals input from an OR gate 410 on a path 411. The signals on the path 392 are also provided to an inverted port 412 of an AND gate 414. The AND gate 414 also receives at a non-inverted port 416 the signals on the path 411 from OR gate 410. Signals from AND gate 414 are provided to a one bit delay device 420 which, for example, may be a flip-flop receiving the AND gate signals and bit clock signals on the path 372 and thereby functional in exactly the same fashion as the flip-flop 164 described with reference to FIG. 5A. The signals from delay device 420 are provided to OR gate 410 over path 424 and, along with the signal from path 402 also provided to OR gate 410, form the signals on path 411.

It is shown in the referenced article by Kaneko that the desired LPCM signal is the data stream on path 392 less a constant, 16. The half-subtractor 394 is provided for this purpose. Since the least significant bit of the data on path 392 is a decimal bit, the constant sixteen corresponds to the binary number 1000.0, i.e. a logic 1 at the fifth data bit. Then operation of the half subtractor is as follows.

For the first four data bits, the signals on the path 402 are logic 0's, the output of the delay device 420 are logic 0's, and hence the signal from OR gate 410 on path 411 are logic 0's. Therefore, the first four data bits output from the half-adder 408 onto path 426 are the first four data bits input on path 392. At the fifth data bit, however, the signal on path 402 becomes a logic 1, and hence the output of OR gate 410 on path 411 to half-adder 408 becomes a logic 1. The fifth bit output on path 426 from half-adder 408 is then a logic 1 only if the fifth bit input to the half-adder 408 on path 392 is a logic 0, otherwise it is a logic 0.

When the fifth bit input on path 392 is a logic 1, the output of gate 414 is a logic 0 because of the inversion operation on port 412. This logic 0 is delayed in device 420 to the sixth bit and since the sixth bit on path 402 is a logic 0, it is obvious that the sixth bit on path 411 is also a logic 0. Hence the sixth bit output on path 426 is again the same as the sixth bit input on path 392. Moreover, since the data bits on path 402 are all logic 0's for the sixth bit and thereafter, the output from gate 414 remains at logic 0 and the data bits on path 411 are always logic 0's after the sixth bit. Therefore, the data bits output on path 426 remain the same as the data bits input on path 392 after the sixth bit.

However, when the fifth bit input on path 392 is a logic 0, it is inverted to a logic 1 at port 412 of AND gate 414 and, together with the logic 1 from path 402 through OR gate 410 and on path 411 to port 416 of AND gate 414, triggers a logic 1 from AND gate 414. This logic 1 is delayed to the sixth bit in delay device 420 and then output via path 424, OR gate 410 and path 411 to half-adder 408 and port 416 of AND gate 414, the signal on path 402 at the sixth and all succeeding bits of the signal on path 392 having returned to logic 0. Then, if the sixth bit on path 392 is a logic 1, half-adder 408 outputs a logic 0 to path 426 while the logic 1 on path 392 is inverted at port 412 to a logic 0 to trigger a logic 0 from AND gate 414. At the next, seventh, bit of the signal on path 392, the signal on path 411 is then a logic 0 and half-adder 408 outputs to path 426 each bit input over path 392 as before described. But if the sixth bit on path 392 is a logic 0, it is inverted to a logic 1 at port 412 of AND gate 414 and, together with the logic 1 on path 411 from delay device 420, triggers another logic 1 from AND gate 414. Thus it is seen that, after the fifth bit, the half-subtractor inverts each bit input on path 392 through and including the first logic 1 and then repeats each bit input on path 392 for output on path 426. Therefore the operation of subtracting 16 has been performed. Finally, it is noted that there is always at least one logic 1 after the fifth bit on path 392 because of the logic 1 preset in shift register 366, as earlier described.

The resulting 14-bit serial LPCM magnitude signals on path 426 are carried to a serial to parallel shift register at 428. Shift register 428 is shown to be comprised of two, connected, shift register devices 628, 630 each of which may be of a type designated SN74164 and commercially available from Texas Instruments Incorporated. Each shift register device 628, 630 receives signals from a clock (not shown) on a path 632 at 112 KHz for clocking each of the 14 bits of the serial LPCM magnitude signal into the devices 628, 630 from the path 426 and signals from a clock (not shown) on a path 634 at 8 KHz for clocking each bit of the LPCM signal onto one of discrete parallel output paths $Q_1$–$Q_{14}$. Each path $Q_1$–$Q_{14}$ is connected to a discretely corresponding input port of a parallel to serial shift register at 429 shown to be comprised of two, connected, parallel to serial shift register devices 636, 638. Devices 636, 638 may each be of a type designated SN74165 which is commercially available from Texas Instruments Incorporated. Each device 636, 638 receives signals from a clock (not shown) on path 640 at 16 KHz to load the signals then on parallel paths $Q_1$–$Q_{14}$ into the devices and a signal from a clock (not shown) on path 642 at 224 KHz to output each of the 14 bits of the LPCM signal input from the parallel paths $Q_1$–$Q_{14}$ onto path 180' as a serial signal. Since devices 636, 638 load the parallel signals from paths $Q_1$–$Q_{14}$ at 16 KHz while the parallel signals on paths $Q_1$–$Q_{14}$ are output from devices 628, 630 at 8 KHz, two 16 KHz LPCM signals are output on path 180' for each LPCM signal input on path 426. Shift registers 428, 429 thus form the lower to higher speed converter 38 shown in FIG. 2.

The two's complement converter 36 shown in FIG. 8A receives the signals on path 180'. It is, as described with reference to FIG. 7, substantially identical to that described with reference to FIG. 5A. Therefore, no further general description need be given here. However, it is now specifically noted that the converter additionally comprises a flip-flop 440. As with the flip-flop 164 described with reference to FIG. 5A, this flip-flop 440 delays the input sign signal on path 322 one clock signal input on path 190'. This one clock cycle delayed sign signal is then output over a path 442 to the two sample accumulator 304.

The accumulator 304 also receives the LPCM signals, now in two's complement format on the path 206', in the serial to serial shift register 330 of the accumulator 304. This register 330 is now shown to be comprised of two, connected serial to serial shift register devices 444 and 446 each of which are of a type designated SN74164 and commercially available from Texas Instruments Incorporated. The shift register devices 444 and 446 also receive a 16 KHz signal on a path 443 from a clock (not shown) which enables the registers to receive each of the successive 16 KHz LPCM signal words on the path 206' and a 224 KHz signal on a path 445 from a clock (not shown) to strobe each of the 13 bits of the LPCM signal out of the devices and onto an output path 448. Since each of the 13 bits of a LPCM signal is then strobed through the devices during one 16 KHz clock cycle, these shift register devices 444 and 446 delay each LPCM signal output on path 448 one LPCM signal cycle from its input on path 206'. The output LPCM signals on the path 448 are provided to an OR gate 450 also receiving the one cycle delayed sign signal on the path 442 which is added to the delayed LPCM signal as a 14th bit of the LPCM signal output from the OR gate 450 over the path 454. The accumulator 304 also comprises another OR gate 452 receiving, without delay, the LPCM signals input over the path 206' together with the sign signal on path 322 which is also added as the 14th bit of the LPCM signal output from gate 452 on path 458.

The signed, delayed LPCM signal from the OR gate 450 is provided over the path 454 to the adder 332. The adder 332 also receives over path 458 the un-delayed, signed LPCM signals from the OR gate 452. The adder 332 is a serial adder, adding each successive bit of the two signed LPCM signals input over the paths 454 and 458. For example, it may be a device commercially designated SN7480 by Texas Instruments Incorporated. If the two input bits are logic 1's, it is necessary to carry a logic 1 and for this purpose the device 332 then outputs a logic 1 signal over a path 342 to a flip-flop 462 comprising delay device 334. Flip-flop 462 also receives the 224 KHz signal from path 445 to clock the flip-flop at each bit. The flip-flop also receives the 16 KHz signal on path 443 to be reset at the end of each LPCM signal word to prevent carryover of a bit from one word to the next. Again, as with the flip-flop 440, the flip-flop 462 delays one bit from its input on the path 342. The signal on the path 464 is provided to the adder 332 which adds this input signal to those input on the paths 454 and 458. This arrangement will be recognized to constitute a portion of the adder scheme described earlier with reference to FIGS. 4 and 5. The output signals from the adder 332 are then seen to comprise two added, signed LPCM signals and are provided over a path 468 to the serial to parallel shift register 308.

This shift register 308 is now seen to be comprised of series-connected register devices 470 and 472 each of which are of a type designated SN74164 and commercially available from Texas Instruments Incorporated. The shift register devices 470, 472 also receive the 16 KHz clock signal on the path 443 and the 224 KHz clock signal on the path 445. The 224 KHz signal advances each bit of the input LPCM words into the shift register devices while the 16 KHz signal enables parallel output of the input LPCM signals. However, when enabled by the 16 KHz clock signals, the shift register devices 470, 472 effectively output over paths QB1-QE2 only the last 12 bits of the 15 bit LPCM signal, the path QA1 being terminated. The output of the last 12 input bits is equivalent to dividing the input signal by two followed by a 3-bit truncation. 12 bits are chosen to match the length of the signal to that of counter 14 of FIG. 1 in the encoder so that the same integrator step size can be used for the encoder and decoder.

From the description of shift registers 428, 429 in converter 38 which repeat each input LPCM word by doubling the word frequency, the accumulator 304 which adds each of the higher, double speed LPCM signals to the next signal, and the shift register 308 which divides each of the added higher speed LPCM signals by two, these devices are seen to perform the lower to higher speed conversion and filtering described for converter 38 and filter 39 (FIG. 2). This operation is functionally illustrated in FIG. 9. In FIG. 9 each successive LPCM signal decoded from an input CPCM signal as on path 426 (FIG. 8) is illustrated as a pulse 601, 602, 603 having an amplitude corresponding to the value encoded in the LPCM signal, it being noted that the LPCM signals are actually a series of binary-encoded signal bits. As these lower speed LPCM signals pass through speed converter 38, each signal is repeated at a higher frequency, here twice the input frequency, to form repeated sets of the input signals now forming a train of higher speed LPCM signals, each set being the input lower speed LPCM signal and a repeat thereof as, for example, the set 601, 601'.

Successive ones of these higher speed LPCM signals are then added and averaged in filter 39 to form average higher speed LPCM signals. For example, signals 601, 601' are added and averaged to form average signal $\overline{601-601'}$ which, of course, is the same as input signal 601 since signal 601' was a repeat thereof, just as illustrated in FIG. 9. It is noted that the average higher speed signals are delayed one signal from the first of the higher speed signals forming the average signal, but, since all average signals are so delayed, this is no problem. Signals 601', 602 are then averaged to form signal $\overline{601'-602}$ which is now seen to be of an amplitude or value average that of signal 601' and signal 602. Note that signal $\overline{601'-602}$ occurs at the interface of successive sets of the higher speed LPCM signals as earlier described for the operation of filter 39.

The next average, higher speed LPCM signal $\overline{601-602'}$, is seen to correspond to input LPCM signal 602 just as signal $\overline{601-601'}$ corresponded to signal 601. These operations then continue on the successive LPCM signals to effectively smooth or filter the transitions between the encoded values of the successive LPCM signals.

Figure 8B:
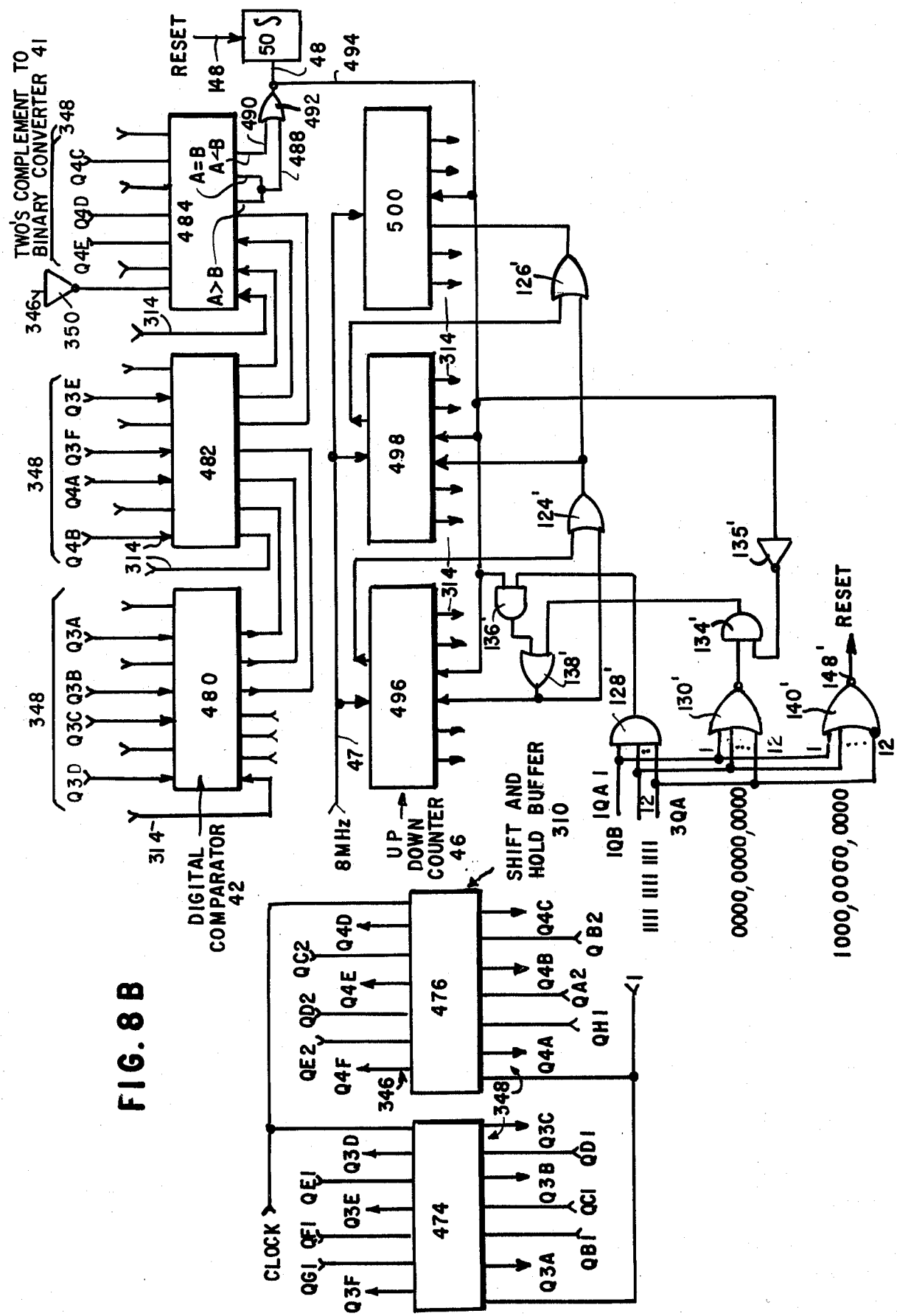

Turning to FIG. 8B, the average higher speed LPCM signals just described are provided over the discretely identified paths QB1-QE2 to parallel to parallel shift and hold devices 474, 476 which comprise the shift and hold buffer 310. The devices 474, 476 may be of a type designated SN74174 and commercially available from Texas Instruments Incorporated. As earlier described with reference to FIG. 7, this buffer device merely stretches each bit of the signals input on the paths Q1B-QE2 over the full interval of the 16 KHz LPCM signal word formed by the bits for more convenient further processing than over the significantly shorter interval of the 224 KHz bit signals input to the serial to parallel shift register 308 and therefore output from that register 308 to buffer 310. The output signals from the buffer 310 are provided over paths identified as Q3A-Q4F corresponding, respectively, to the input paths Q1B-QE2, the signal on the path Q4F then being the most significant bit. This path Q4F is therefore path 346 earlier identified in FIG. 7 while the remaining paths Q3A-Q4E are the parallel output paths 348 also identified in FIG. 7. The signal on the path 346 is then provided to inverter 350 to accomplish the two's complement to offset binary conversion of converter 41 while the signals on the paths 348 are directly provided to the digital, comparator 42.

The digital comparator 42 is now seen to be comprised of three parallel input comparator devices 480, 482 and 484 each of which are of a type designated SN7485 and commercially available from Texas Instruments Incorporated. The devices 480, 482, and 484 also receive input signals over a corresponding number of parallel paths 314 from the up-down counter at 46. Each of the signals input over the paths 346, 348 is compared with the signal input over a corresponding one of the paths 314 to generate a single output signal bit. If the LPCM signal input over the paths 348, 346 exceeds the signal input over the paths 314, or the signals are equal, a high logic level signal is provided over an output path 488. If, on the other hand, the signals input over the paths 346, 348 are less than the signals input over the path 314, a low logic level signal is provided to an output path 490. The signals on the paths 490, 488 are provided to an OR gate 492 and from the OR gate 492 on a portion 494 of path 48 to the up-down counter 46 and on path 48 to the integrator 50.

Turning first to the up-down counter 46, the counter is now shown to be comprised of three connected, up-down counter devices 496, 498 and 500 each of which are of a type designated SN74191 and commercially available from Texas Instruments Incorporated. Each of these counter devices 496, 498, 500 respond to high logic level signals received over the path portion 494 by incrementing upward and respond to low logic level signals received over the path portion 494 by decrementing or down-counting. Each of the counter devices 496, 498, 500 also receives a clock signal over a path 47 from a clock device (not shown). To permit the integrator 50 to be of the same design as the integrator 30 described with reference to FIG. 1, the clock signals on the path 47 are at 8 MHz, the same as the strobe frequency provided over the path 26 to the comparator 24 (FIG. 1). Each of the clock signals over the path 47 enables parallel output of signals representing the count then stored in each of the counter devices 496, 498, 500 over the parallel output paths 314 to the comparator devices 480, 482, 484. Since the LPCM signals input to the comparator over the paths 346, 348 recur only at 16 KHz while the signals over the paths 314 are enabled at 8 MHz, it is clear that 500 signals from the up-down counter 46 are received over paths 314 for each LPCM word input to the comparator 42 over the paths 346, 348.

The up-down counter 46 also receives enabling signals from AND gate 128' and NAND gate 130'. The gates 128' and 130' each receive the signals over the parallel output paths 314 from the up-down counter 46. The arrangement of the gates 128', 130', as well as another gate 146' soon to be described, will be recognized as the same as that of the gates 128, 130 and 146 connected to the up-down counter 14 as described in detail with reference to FIG. 5. Accordingly, a detailed description of the operation of these gates need not be given again to understand that the gate 128' responds to the full count of counter 46 providing all logic 1 signals to each of the output paths 314 to disable the up-down counter 46 from counting an additional high logic level input from path portion 494 and thereby overflowing, while the gate 130' responds to all logic 0 signals over the paths 314 to prevent the up-down counter 46 from down-counting below its full zero state. Therefore, if the counter 46 reaches its full count of all logic 1's and the next signal over the path 494 is a high logic level signal otherwise requiring the counter to increment, the signal from gate 128' disables each of the counter devices 496, 498 and 500 from counting this next signal. On the other hand, if the counter 46 reaches its full zero count and the next signal over the path 494 is a low logic level signal otherwise requiring the counter devices 496, 498, 500 to down-count, the signal from gate 130' disables each counter from such operation.

Similarly, the gate 146' is seen to respond to the half full state of the up-down counter 46 to provide a signal over output path 148'. If offset binary format, the half-full state of the counter corresponds to the number zero and the signal over the path 148' then represents a zero condition of the LDM signal output over the path 48. To assure that the integrator 50 appropriately identifies this zero signal, the signal over the path 148' is provided to reset the integrator just as described with reference to the reset signal on the path 148 in connection with FIG. 5. Path 148' thus corresponds to path 49 (FIG. 2).

The signals output to the integrator 50 over the path portion 494 are thus seen to be in the LDM form. Then, if the number in the counter 46 representing the accumulated total of these LDM signals is less than the LPCM signals input to the comparator 42 over the paths 346, 348, the comparator will continue to provide successive high logic level signals over the path 488 through OR gate 492 to the path 48 until the number in the up-down counter 46 exceeds that of the LPCM signal then input to the comparator 42. Since the clock frequency of the signals input over the path 47 to the up-down counter 46 greatly exceeds that of the LPCM signals input to the comparator 42 over paths 346, 348, the count in the counter 46 quickly reaches that of the LPCM signal. Once having reached the LPCM signal, the accumulated count of the LDM signals in the counter will alter around the LPCM level by one least significant bit until a new LPCM sample arrives. Thus, together, the up-down counter 46 and digital comparator 42 function as a digital LPCM to LDM decoder or demodulator 43 as described with reference to FIG. 2.

Having thus described my invention, what I claim is:

1. A communication system for the conversion of linear pulse code modulation signals to linear delta modulation signals and then to analog signals comprising input means via which linear pulse code modulation signals are received, speed conversion means coupled to said input means including buffer register means operable to increase the frequency of the received signals, converter means for converting the signals output from said speed conversion means to two's complement format, digital filter means including register means coupled to the output of said converter means, first means for adding each word output from said converter means to the preceding word received from said register means, and second means for registering the output of said first means, further means for effectively dividing each word output from said second means by a predetermined number, means coupled to said further means to invert the sign bit to thereby convert the signals to offset binary format, a digital delta modulator including up-down counter means, said digital delta modulator being responsive to said signals in the offset binary format to output linear delta modulation signals, an analog line, integrating means coupled between the output of the digital delta modulator and the analog line to convert the delta modulated signals to analog signals, and reset means for resetting the integrating means to a zero analog level in response to detection of a zero count in the up-down counter means.

2. A communication system as in claim 1, wherein said digital delta modulator comprises a digital comparator having output and input means in which said up-down counter is connected between said output and said input means of said digital comparator, said digital comparator having means to compare each of said words in the offset binary format several times with successive words from said up-down counter means, and to produce a linear delta modulation signal output bit with each comparison.

3. A communication system as in claim 1, in which said input means for providing linear pulse code modulation signals includes means operable to convert compressed pulse code modulation signals to linear pulse code modulation signals, having an input coupled to a digital transmission line over which compressed pulse code modulation signals are received, and an output which couples said linear pulse code modulation signals to said speed conversion means.

* * * * *